(12) United States Patent
Suzuki et al.

(10) Patent No.: US 8,502,301 B2
(45) Date of Patent: Aug. 6, 2013

(54) SEMICONDUCTOR DEVICE AND METHOD FOR FABRICATING THE SAME

(75) Inventors: Ken Suzuki, Kyoto (JP); Jun Suzuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 236 days.

(21) Appl. No.: 12/482,945

(22) Filed: Jun. 11, 2009

(65) Prior Publication Data

US 2009/0242995 A1    Oct. 1, 2009

Related U.S. Application Data

(63) Continuation of application No. PCT/JP2008/002758, filed on Oct. 1, 2008.

(30) Foreign Application Priority Data

Nov. 16, 2007  (JP) .................................. 2007-297639

(51) Int. Cl.
*H01L 29/78* (2006.01)

(52) U.S. Cl.
USPC .................... 257/327; 257/616; 257/E29.255

(58) Field of Classification Search
CPC ............ H01L 29/7842; H01L 29/7848; H01L 29/66636
USPC ............................. 257/19, 616, 327, E29.255
See application file for complete search history.

(56) References Cited

U.S. PATENT DOCUMENTS

| | | | |
|---|---|---|---|
| 6,621,131 B2 | 9/2003 | Murthy et al. | |
| 6,891,192 B2 | 5/2005 | Chen et al. | |
| 7,759,199 B2 * | 7/2010 | Thomas et al. | 438/269 |
| 7,772,095 B2 * | 8/2010 | Dyer | 438/478 |
| 7,786,518 B2 * | 8/2010 | Chakravarthi et al. | 257/288 |
| 2001/0034104 A1 | 10/2001 | Lee | |
| 2001/0055842 A1 * | 12/2001 | Uh et al. | 438/183 |
| 2005/0285203 A1 | 12/2005 | Fukutome et al. | |
| 2006/0027855 A1 * | 2/2006 | Hur et al. | 257/315 |
| 2007/0057324 A1 | 3/2007 | Tews et al. | |
| 2007/0096201 A1 * | 5/2007 | Ning | 257/321 |

(Continued)

FOREIGN PATENT DOCUMENTS

| | | |
|---|---|---|
| JP | 10-326892 | 12/1998 |
| JP | 11-163325 | 6/1999 |
| JP | 2006-013428 | 1/2006 |
| WO | WO 2006/006972 A1 | 1/2006 |

*Primary Examiner* — Jerome Jackson, Jr.
*Assistant Examiner* — Yu Chen
(74) *Attorney, Agent, or Firm* — McDermott Will & Emery LLP

(57) ABSTRACT

A semiconductor device includes an isolation region (11*a*) formed in a semiconductor substrate (10), an active region made of the semiconductor substrate (10) surrounded by the isolation region (11*a*) and having a trench portion, a MIS transistor of a first-conductivity type having a gate electrode (13) formed on the active region, a first sidewall (19) formed on a side surface of the gate electrode between the gate electrode (13) and the trench portion as viewed in the top, and a silicon mixed crystal layer (21) of the first-conductivity type, the trench portion being filled with the silicon mixed crystal layer (21) of the first-conductivity type, a substrate region provided between the trench portion and the isolation region (11*a*, 11*b*) and made of the semiconductor substrate (10), and an impurity region (22) of the first-conductivity type formed in the substrate region. The silicon mixed crystal layer (21) generates stress in a channel region of the active region.

19 Claims, 13 Drawing Sheets

(56) References Cited

U.S. PATENT DOCUMENTS

| | | |
|---|---|---|
| 2007/0126036 A1 | 6/2007 | Ohta et al. |
| 2007/0200170 A1 | 8/2007 | Yamasaki et al. |
| 2009/0170270 A1* | 7/2009 | Chakravarthi et al. ........ 438/300 |
| 2009/0184341 A1* | 7/2009 | Chong et al. .................. 257/190 |

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

SEMICONDUCTOR DEVICE AND METHOD FOR FABRICATING THE SAME

RELATED APPLICATIONS

This application is a continuation of International Application No. PCT/JP2008/002758, with an International filing date of Oct. 1, 2008, which claims priority of Japanese Patent Application No. 2007-297639, filed on Nov. 16, 2007, the contents of which are hereby incorporated by reference.

TECHNICAL FIELD

The present invention relates to a semiconductor device having a MIS (Metal Insulator Semiconductor) transistor and its method of fabrication.

BACKGROUND ART

In order to improve properties of a semiconductor device, such as operation, power consumption, packing density and the like, a minimum feature size has been reduced. It is considerably technically difficult to fabricate semiconductor devices having a minimum feature size of 65 nm or less. The improvement of the properties only by miniaturization is approaching its limit.

To avoid this, a so-called strained silicon transistor has attracted attention as a transistor whose properties are improved even without miniaturization. The strained silicon transistor is a MIS transistor in which the mobility of carriers is increased by applying stress (strain) to the channel region (see, for example, Patent Documents 1 and 2). For example, in the case of a p-type MIS transistor, when compressive stress is applied in a gate length direction to the channel region of the p-type MIS transistor that is formed on a main surface of the silicon substrate having a (100) plane orientation, the mobility of positive holes increases, resulting in an increase in transistor drive capability.

Hereinafter, a method for fabricating a conventional semiconductor device having compressive stress will be described with reference to FIG. 13. FIGS. 13(a) to 13(d) are cross-sectional views showing the method for fabricating the conventional semiconductor device.

Initially, as shown in FIG. 13(a), an active region 100A is formed in an upper portion of the semiconductor substrate 100 so that the active region 100A is made of a semiconductor substrate 100 and is surrounded by isolation regions 101, and thereafter, a gate insulating film 102, a gate electrode 103 and a protective insulating film 104 are formed on the active region 100A. Thereafter, p-type extension regions 105 are formed in regions of the active region 100A each of which is located on a side of and below the gate electrode 103.

Next, as shown in FIG. 13(b), sidewalls 106 are formed on side surfaces of the gate electrode 103, and thereafter, exposed regions of the semiconductor substrate 100 are etched to desired depths. As a result, trench portions 107 are formed in regions between the sidewalls 106 and the isolation regions 101 of the active region 100A as viewed in the top.

Next, as shown in FIG. 13(c), a p-type SiGe layer 108 is epitaxially grown in the trench portions 107. Thereafter, predetermined steps are performed to complete fabrication of the conventional semiconductor device.

According to this fabrication method, it is possible to fabricate a semiconductor device including a p-type MIS transistor having the p-type SiGe layer 108 for applying compressive stress in the gate length direction to the channel region immediately blow the gate electrode 103.

Patent Document 1: U.S. Pat. No. 6,621,131
Patent Document 2: Japanese Unexamined Patent Application Publication No. 2006-13428

DISCLOSURE OF THE INVENTION

Problems to be Solved by the Invention

However, the aforementioned conventional semiconductor device fabricating method has a problem that a silicon mixed crystal layer having a strain, such as a SiGe layer or the like, cannot be epitaxially grown to a desired thickness in a trench in a satisfactorily controlled manner.

Specifically, when a SiGe layer is epitaxially grown, the insulating film of the isolation region is exposed to the inside of the trench portion, i.e., silicon as a substrate for epitaxial growth is not provided, resulting in poor epitaxial growth, which makes it difficult to form a SiGe layer having a desired thickness.

In view of the aforementioned conventional problems, an object of the present invention is to provide a semiconductor device including a silicon mixed crystal layer that is epitaxially grown to a desired thickness in a satisfactorily controlled manner and has a satisfactory characteristic, and its method of fabrication.

Solution to the Problems

To achieve the object, a semiconductor device according to the present invention includes a semiconductor substrate, an isolation region formed in the semiconductor substrate, an active region made of the semiconductor substrate surrounded by the isolation region and having a trench portion, a MIS transistor of a first-conductivity type having a gate electrode formed on the active region, a first sidewall formed on a side surface of the gate electrode between the gate electrode and the trench portion as viewed in a plane, and a silicon mixed crystal layer of the first-conductivity type for generating stress in a channel region of the active region, the trench portion being filled with the silicon mixed crystal layer of the first-conductivity type, a substrate region provided between the trench portion and the isolation region and made of the semiconductor substrate, and an impurity region of the first-conductivity type formed in the substrate region.

In this structure, the substrate region is provided between the trench portion formed in the active region and the isolation region. As a result, when the silicon mixed crystal layer for generating stress in the active region is formed in the trench portion by, for example, epitaxially growth, the silicon mixed crystal layer can be formed in a satisfactorily controlled manner while suppressing the poor growth since an entire inner wall of the trench portion is made of the semiconductor substrate and the isolation region is not exposed. Therefore, according to the semiconductor device of the present invention, a semiconductor device that includes a silicon mixed crystal layer having satisfactory quality and can operate at high speed can be achieved.

Also, since the impurity region having the same conductivity type as that of the silicon mixed crystal layer is formed in the substrate region, it is possible to suppress the occurrence of a leakage current between the silicon mixed crystal layer serving as source/drain regions of the MIS transistor and the semiconductor substrate. Therefore, according to the semiconductor device of the present invention, a highly reliable semiconductor device that suppresses the occurrence of a leakage current in addition to the aforementioned effect can be achieved.

Next, a method according to the present invention is provided for fabricating a semiconductor device including a MIS transistor of a first-conductivity type provided on an active region formed in a semiconductor substrate. The method includes the steps of (a) forming an isolation region in the semiconductor substrate, the isolation region surrounding the active region, (b) after the step (a), forming a gate portion having on the active region a gate electrode, a first protective insulating film formed on the gate electrode, and a first sidewall formed on a side surface of the gate electrode, (c) forming a mask portion on a substrate region that is an end portion of the active region and is adjacent to the isolation region, (d) etching a trench portion formation region of the semiconductor substrate located between the gate portion and the mask portion as viewed in a plane to form a trench portion while leaving the substrate region between the trench portion and the isolation region, (e) filling the trench portion with a silicon mixed crystal layer of the first-conductivity type for generating stress in a channel region of the active region, and (f) forming an impurity region of the first-conductivity type in the substrate region.

In this method, since the mask portion covering the substrate region is formed in the step (c), the trench portion can be formed while leaving the substrate region between the trench portion and the isolation region in the step (d). Therefore, when the silicon mixed crystal layer is formed in the trench portion by epitaxially growth or the like in the step (e), an entire inner wall of the trench portion is formed of the semiconductor substrate without the isolation region being exposed, and therefore, the silicon mixed crystal layer can be satisfactorily epitaxially grown in the trench portion. As a result, the semiconductor device of the present invention can be used to fabricate a semiconductor device that includes a silicon mixed crystal layer having satisfactory quality and can operate at high speed.

Effect of the Invention

According to the semiconductor device of the present invention and its method of fabrication, a silicon mixed crystal layer for generating stress in a channel region of an active region can be formed in a satisfactorily controlled manner, thereby making it possible to improve the drive capability of the semiconductor device.

Figure 1:
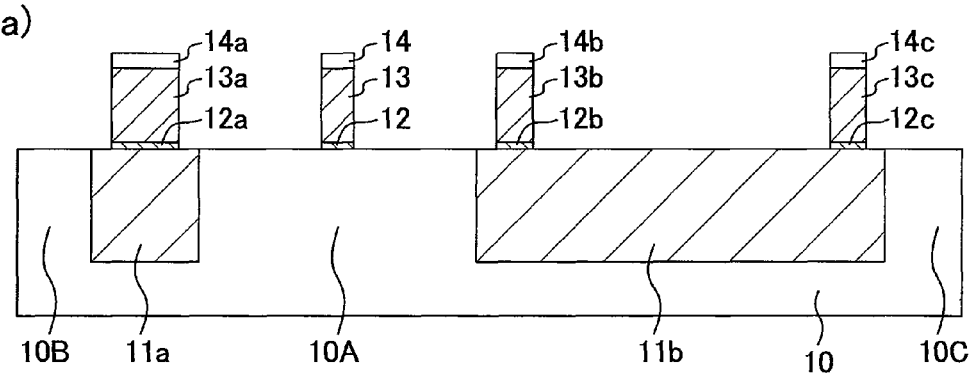
FIGS. 1(a) to 1(c) are cross-sectional views showing a method for fabricating a semiconductor device according to a first embodiment of the present invention.
Figure 1:
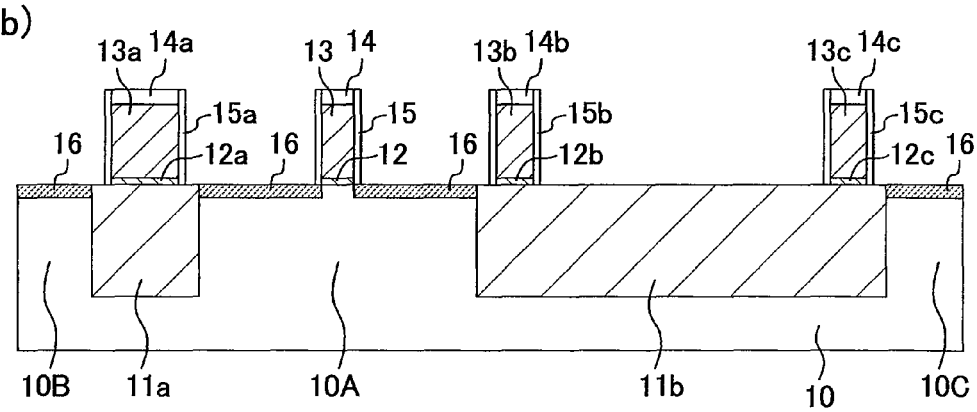
Figure 1:
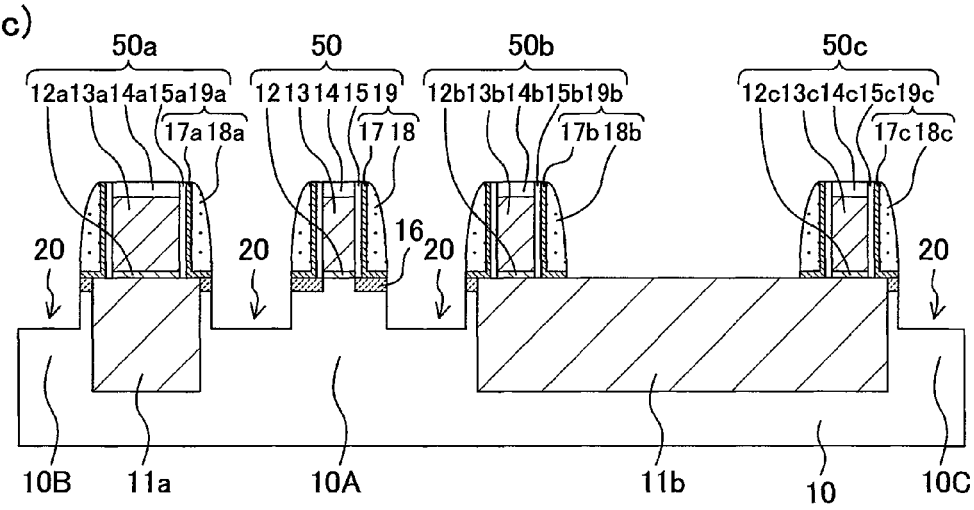

DESCRIPTION OF THE REFERENCE CHARACTERS 10 semiconductor substrate
10A, 10B, 10C active region
11a, 11b isolation region
12 gate insulating film
12a, 12b, 12c dummy gate insulating film
13 gate electrode
13a, 13b, 13c dummy gate electrode
14 protective insulating film
14a, 14b, 14c dummy protective insulating film
15 offset spacer
15a, 15b, 15c offset spacer
16 p-type extension region
17, 17a, 17b, 17c inner sidewall
17A first insulating film
18, 18a, 18b, 18c outer sidewall
18A second insulating film
19, 19a, 19b, 19c sidewall
20 trench portion
21 p-type SiGe layer
22 p-type impurity region
23 metal silicide layer
24 protective film
30, 31 resist
50 gate portion
50a, 50b, 50c, 50d, 50e, 50x mask portion

BEST MODE FOR CARRYING OUT THE INVENTION

First Embodiment

A method for fabricating a semiconductor device according to a first embodiment of the present invention will be described with reference to the drawings. FIGS. 1(a) to 1(c) and FIGS. 2(a) to (c) are cross-sectional views showing the method for fabricating the semiconductor device of this embodiment.

Initially, as shown in FIG. 1(a), trenches are formed in an upper portion of a semiconductor substrate 10 made of silicon (Si) with a main surface having, for example, a (100) plane orientation by, for example, STI (Shallow Trench Isolation). The trenches are filled with an insulating film to selectively form isolation regions 11a and 11b. As a result, active regions 10A, 10B and 10C that are made of the semiconductor substrate 10 and are surrounded by the isolation regions 11a and 11b are formed. Here, an isolation width of the isolation region 11a is narrower than that of the isolation region 11b, and is twice to five times as long as a gate length of a gate electrode as a minimum feature size.

Next, n-type well regions (not shown) are formed in regions including the active regions 10A, 10B and 10C by implanting an n-type impurity, such as P (phosphorus) or the like, into the semiconductor substrate 10 by lithography and ion implantation. Thereafter, for example, a silicon oxynitride film having a film thickness of 2 nm, a polysilicon film having a film thickness of 100 nm, and a silicon oxide film having a film thickness of 30 nm are successively formed on an entire surface of the semiconductor substrate 10. Thereafter, the silicon oxide film, the polysilicon film and the silicon oxynitride film are successively subjected to patterning by photolithography and dry etching to form on the active region 10A a gate insulating film 12 made of the silicon oxynitride film, a gate electrode 13 made of the polysilicon film, and a protective insulating film 14 made of the silicon oxide film. At the same time, a dummy gate insulating film 12a, a dummy gate electrode 13a and a dummy protective insulating film 14a are formed on a middle portion of the isolation region 11a. On the other hand, a dummy gate insulating film 12b, a dummy gate electrode 13b and a dummy protective insulating film 14b are formed on an end portion closer to the active region 10A of the isolation region 11b, while a dummy gate insulating film 12c, a dummy gate electrode 13c and a dummy protective insulating film 14c are formed on an end portion closer to the active region 10C of the isolation region 11b. Note that, in this case, a gate insulating film, a gate electrode and a protective insulating film are also formed on the active regions 10B and 10C, though not shown.

Here, the dummy gate electrode 13a is formed so that the gate length thereof is larger than the gate length of the gate electrode 13 and is narrower than the isolation width of the isolation region 11a, and portions of sidewalls that are to be formed on opposite side surfaces of the dummy gate electrode 13a in a subsequent step overlap the active regions 10A and 10B as viewed in the top. On the other hand, the dummy gate electrodes 13b and 13c are formed so that the gate lengths thereof are substantially the same as the gate length of the gate electrode 13, and portions of sidewalls that are to be formed in a subsequent step overlap the active regions 10A and 10C. Note that the dummy gate insulating films 12a, 12b and 12c do not necessarily need to be provided.

Next, as shown in FIG. 1(b), a silicon oxide film having a film thickness of 5 nm is formed on an entire surface of the semiconductor substrate 10, and thereafter, the silicon oxide film is etched back so that offset spacers 15 having I-shaped cross-sections are formed on side surfaces of the gate electrode 13, and offset spacers 15a, 15b and 15c having I-shaped cross-sections are formed side surfaces of the dummy gate electrodes 13a, 13b and 13c, respectively. Thereafter, boron (p-type impurity) is implanted into the active region 10A at a dose of $4 \times 10^{14}$ ions/cm$^2$ using the gate electrode 13 and the offset spacers 15 as a mask, to form p-type extension regions 16. In this case, p-type extension regions 16 are similarly formed in the active regions 10B and 10C.

Next, as shown in FIG. 1(c), for example, a silicon oxide film having a film thickness of 5 nm and a silicon nitride film having a film thickness of 30 nm are successively deposited on an entire surface of the semiconductor substrate 10 by, for example, CVD (Chemical Vapor Deposition), and thereafter, the multilayer film of the silicon oxide film and the silicon nitride film is etched back. As a result, sidewalls 19 are formed on side surfaces of the gate electrode 13 with the offset spacers 15 being interposed therebetween, while sidewalls 19a, 19b and 19c are formed on side surfaces of the dummy gate electrodes 13a, 13b and 13c with the offset spacers 15a, 15b and 15c being interposed therebetween, respectively.

Here, the sidewall 19 includes an inner sidewall 17 that is made of the silicon oxide film and has an L-shaped cross-section, and an outer sidewall 18 that is made of the silicon nitride film formed on the inner sidewall 17. Similarly, the sidewall 19a includes an inner sidewall 17a that is made of the silicon oxide film and has an L-shaped cross-section, and an outer sidewall 18a that is made of the silicon nitride film formed on the L-shaped inner sidewall 17a. Also, the sidewall 19b includes an inner sidewall 17b that is made of the silicon oxide film and has an L-shaped cross-section, and an outer sidewall 18b that is made of the silicon nitride film formed on the inner sidewall 17b. Similarly, the sidewall 19c includes an inner sidewall 17c that is made of the silicon oxide film and has an L-shaped cross-section, and an outer sidewall 18c that is made of the silicon nitride film formed on the inner sidewall 17c.

Next, exposed regions of the semiconductor substrate 10 are etched to desired depths using as a mask a gate portion 50 having the gate insulating film 12, the gate electrode 13, the protective insulating film 14, the offset spacers 15 and the sidewalls 19, a mask portion 50a having the dummy gate insulating film 12a, the dummy gate electrode 13a, the dummy protective insulating film 14a, the offset spacers 15a and the sidewalls 19a, a mask portion 50b having the dummy gate insulating film 12b, the dummy gate electrode 13b, the dummy protective insulating film 14b, the offset spacers 15b and the sidewalls 19b, and a mask portion 50c having the dummy gate insulating film 12c, the dummy gate electrode 13c, the dummy protective insulating film 14c, the offset spacers 15c and the sidewalls 19c. As a result, trench portions 20 are formed in regions (trench portion formation regions) between the sidewall 19 and the sidewalls 19a and 19b of the active region 10A as viewed in the top. In this case, the sidewalls 19a and 19b are formed on regions (hereinafter referred to as "substrate regions") that are end portions of the active region and are adjacent to the isolation regions 11a and 11b, and therefore, the semiconductor substrate 10 is left between the isolation regions 11a and 11b and the trench portions 20. Since the substrate regions are left, the isolation regions 11a and 11b are not exposed to the inside of the trench portions 20. In this case, trench portions 20 are similarly formed in the active regions 10B and 10C. Here, the trench portions 20 desirably have a depth of about 50 nm.

Next, as shown in FIG. 2(a), a p-type SiGe layer 21 is epitaxially grown to fill the trench portions 20 by supplying, for example, silane gas ($SiH_4$) and germane gas ($GeH_4$) along with p-type dopant gas, such as diborane ($B_2H_6$) or the like, by, for example, MOCVD (Metal Organic Chemical Vapor Deposition) at a temperature of 650 to 700° C. In this case, an upper surface of the p-type SiGe layer 21 desirably has a height higher than or substantially equal to a height of an upper surface of the semiconductor substrate 10 immediately below the gate electrode 13. In this case, the p-type SiGe layer 21 can apply sufficient stress to a channel region formed below the gate electrode 13, so that the drive capability of the p-type MIS transistor can be further enhanced.

Next, as shown in FIG. 2(b), the semiconductor substrate 10 is subjected to thermal processing so that the p-type impurity in the p-type SiGe layer 21 is diffused into the semiconductor substrate 10. As a result, p-type impurity regions 22 are formed in regions (substrate regions) located between the isolation regions 11a and 11b and the p-type SiGe layer 21 of the active region 10A. In this case, p-type impurity regions 22 are similarly formed in the active regions 10B and 10C. By this step, p-type source/drain regions including the p-type SiGe layer 21 and the p-type impurity regions 22 are formed in regions each of which is located outside and below the corresponding sidewall 19.

Here, in the step of FIG. 2(b), a p-type impurity (e.g., boron) may be implanted into the active regions 10A, 10B and 10C including the p-type SiGe layer 21 at a dose of $4 \times 10^{15}$ ions/cm$^2$ and at an implantation angle of 10° to 25° (angled ion implantation) using the gate electrode 13 and the sidewalls 19 as a mask, followed by thermal processing, to form the p-type impurity regions 22. In this case, as compared to when only the p-type impurity in the p-type SiGe layer 21 is diffused to form the p-type impurity regions 22, the p-type impurity region 22 having a high concentration can be reliably formed in the substrate regions by quick thermal processing.

Next, as shown in FIG. 2(c), the protective insulating film 14 provided on the gate electrode 13 is removed, and thereafter, a metal film made of, for example, nickel (Ni), cobalt (Co), platinum (Pt) or the like is deposited on the semiconductor substrate 10 by sputtering or the like. Thereafter, the deposited metal film is subjected to annealing to form a metal silicide layer 23 on each of the gate electrode 13 and the p-type SiGe layer 21. Next, an interlayer insulating film, a contact plug, a metal wiring and the like (not shown) are formed on the semiconductor substrate 10, thereby completing fabrication of the semiconductor device of this embodiment.

The method for fabricating the semiconductor device of this embodiment is characterized in that the trench portions 20 are formed using the gate portion 50 and the mask portions 50a, 50b and 50c in the step of FIG. 1(c). With this method, portions of the sidewalls 19a, 19b and 19c forming the mask portions 50a, 50b and 50c cover regions (substrate regions) that are end portions of the active regions and are adjacent to the isolation regions 11a and 11b. Therefore, the substrate regions can be left between the trench portions 20 and the isolation regions 11a and 11b. As a result, an entire inner wall of the trench portion 20 is made of the semiconductor substrate without the isolation regions 11a and 11b being exposed from a surface of the trench portion 20. Therefore, epitaxial growth can be satisfactorily performed to obtain the p-type SiGe layer 21 having a desired characteristic. Therefore, according to the method for fabricating the semiconductor device of this embodiment, a semiconductor device that includes a p-type SiGe layer having a satisfactory characteristic and can operate at high speed can be fabricated.

Also, in the method for fabricating the semiconductor device of this embodiment, the dummy gate electrode 13a, 13b and 13c, the dummy protective insulating films 14a, 14b and 14c, and the sidewalls 19a, 19b and 19c that form the mask portions, are formed in the same steps that form the gate electrode 13, the protective insulating film 14 and the sidewalls 19 of the MIS transistor, respectively. Therefore, the trench portions 20 can be relatively easily formed without providing additional steps so as to form the mask portions.

Note that when the isolation region 11b having an isolation width sufficiently larger than the gate length of the gate electrode 13 is provided as in the method for fabricating the semiconductor device of this embodiment, it is desirable that the dummy gate electrode 13b having the same gate length as that of the gate electrode 13 be provided at each of opposite end portions of the isolation region 11b. As a result, a mask layout pattern for forming the dummy gate electrodes 13b and 13a can be relatively easily formed, optimal etching conditions can be used, and the like. Also, when the isolation region 11a having an isolation width that is larger than the gate length of the gate electrode 13 and is smaller than the isolation width of the isolation region 11b is provided, the gate length of the dummy gate electrode 13a may be set in view of the isolation width of the isolation region 11a and the widths of the sidewalls 19a so as to form the trench portions 20 in desired regions as described above. Note that the isolation widths of the isolation regions 11a and 11b in the fabrication method of this embodiment are only for illustrative purposes. The present invention is not limited to this.

Next, a structure of the semiconductor device of this embodiment will be briefly described with reference to FIG. 2(c). Note that the materials, film thicknesses, formation methods and the like of the parts are similar to those which have been described above.

As shown in FIG. 2(c), the semiconductor device of this embodiment includes the semiconductor substrate 10, the isolation regions 11a and 11b formed in the semiconductor substrate 10, the active region 10A made of the semiconductor substrate 10 surrounded by the isolation regions 11a and 11b and having the trench portions, the p-type MIS transistor formed on the active region 10A, the substrate regions provided between the trench portions and the isolation regions 11a and 11b, and the p-type impurity regions 22 made of the semiconductor substrate 10 and formed in the substrate regions.

Here, the p-type MIS transistor has the gate insulating film 12 and the gate electrode 13 successively formed on the active region 10A in this stated order from the bottom, the offset spacers 15 formed on the side surfaces of the gate electrode 13, the sidewalls 19 formed on the offset spacers 15 and between the gate electrode 13 and the trench portions as viewed in the top, the p-type extension regions 16 formed in regions of the active region 10A each of which is located on a side of and below the gate electrode 13, and the p-type source/drain regions that include the p-type SiGe layer 21 and the p-type impurity regions 22 and are formed in regions each of which is located outside and below the corresponding sidewall 19. Here, the trench portions are filled with the p-type SiGe layer 21, which generate stress in the channel region of the active region. Note that the sidewall 19 includes the inner sidewall 17 having an L-shaped cross-section, and the outer sidewall 18 formed on the inner sidewall 17. Also, the metal silicide layer 23 is formed on the gate electrode 13 and the p-type SiGe layer 21.

Moreover, the semiconductor device of this embodiment includes the dummy gate insulating films 12a and 12b, the dummy gate electrodes 13a and 13b, and the dummy protective insulating films 14a and 14b that are successively formed on the isolation regions 11a and 11b, respectively, in this stated order from the bottom, the offset spacers 15a and 15b formed on the side surfaces of the dummy gate electrodes 13a and 13b, and the sidewalls 19a and 19b formed on the offset spacers 15a and 15b, covering the substrate regions. Note that the sidewall 19a includes the inner sidewall 17a having an L-shaped cross-section, and the outer sidewall 18a formed on the inner sidewall 17a. Similarly, the sidewall 19b includes the inner sidewall 17b having an L-shaped cross-section, and the outer sidewall 18b formed on the inner sidewall 17b.

The semiconductor device of this embodiment having the structure described above includes the p-type SiGe layer 21 formed in regions of the active region 10A each of which is located on the corresponding one of opposite sides of and below the gate electrode 13. The p-type SiGe layer 21 that contains Ge, which has a larger lattice constant than that of Si, generates strain due to compressive stress in the gate length direction. As a result, the p-type SiGe layer 21 applies compressive stress to the channel region of the active region 10A located below the gate electrode 13, so that the drive capability of the p-type MIS transistor can be improved, resulting in a semiconductor device that can operate at high speed.

Also, the p-type impurity regions 22 are formed in the substrate regions that are end portions of the active region 10A and are adjacent to the isolation regions 11a and 11b. As a result, it is possible to reduce a leakage current occurring between the p-type source/drain regions (the p-type SiGe layer 21 and the p-type impurity regions 22) and the semiconductor substrate 10 (n-type well region (not shown)).

(First Variation of First Embodiment)

Figure 2:
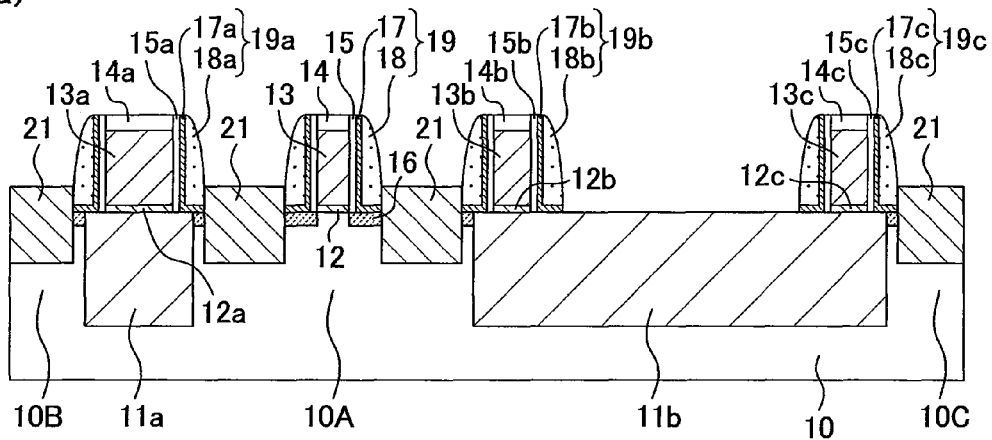
FIGS. 2(a) to 2(c) are cross-sectional views showing the method for fabricating the semiconductor device of the first embodiment of the present invention.
Figure 2:
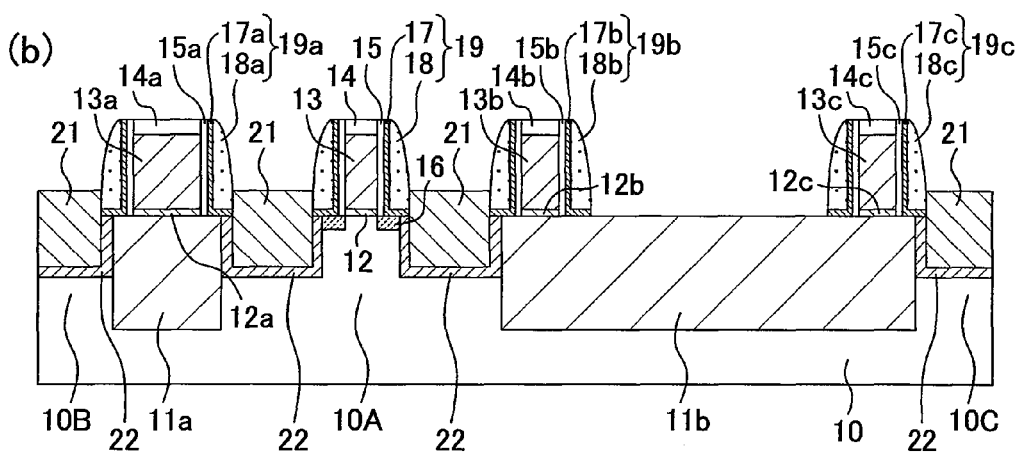
Figure 2:
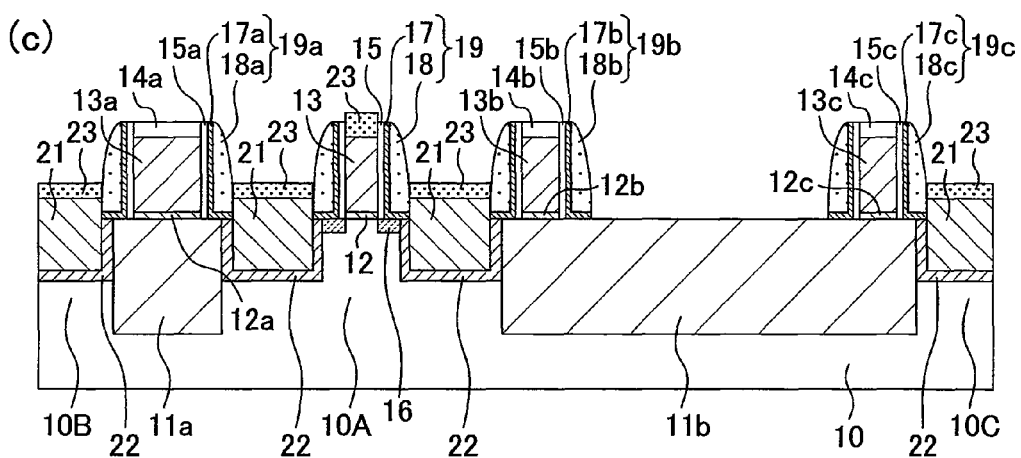
Figure 3:
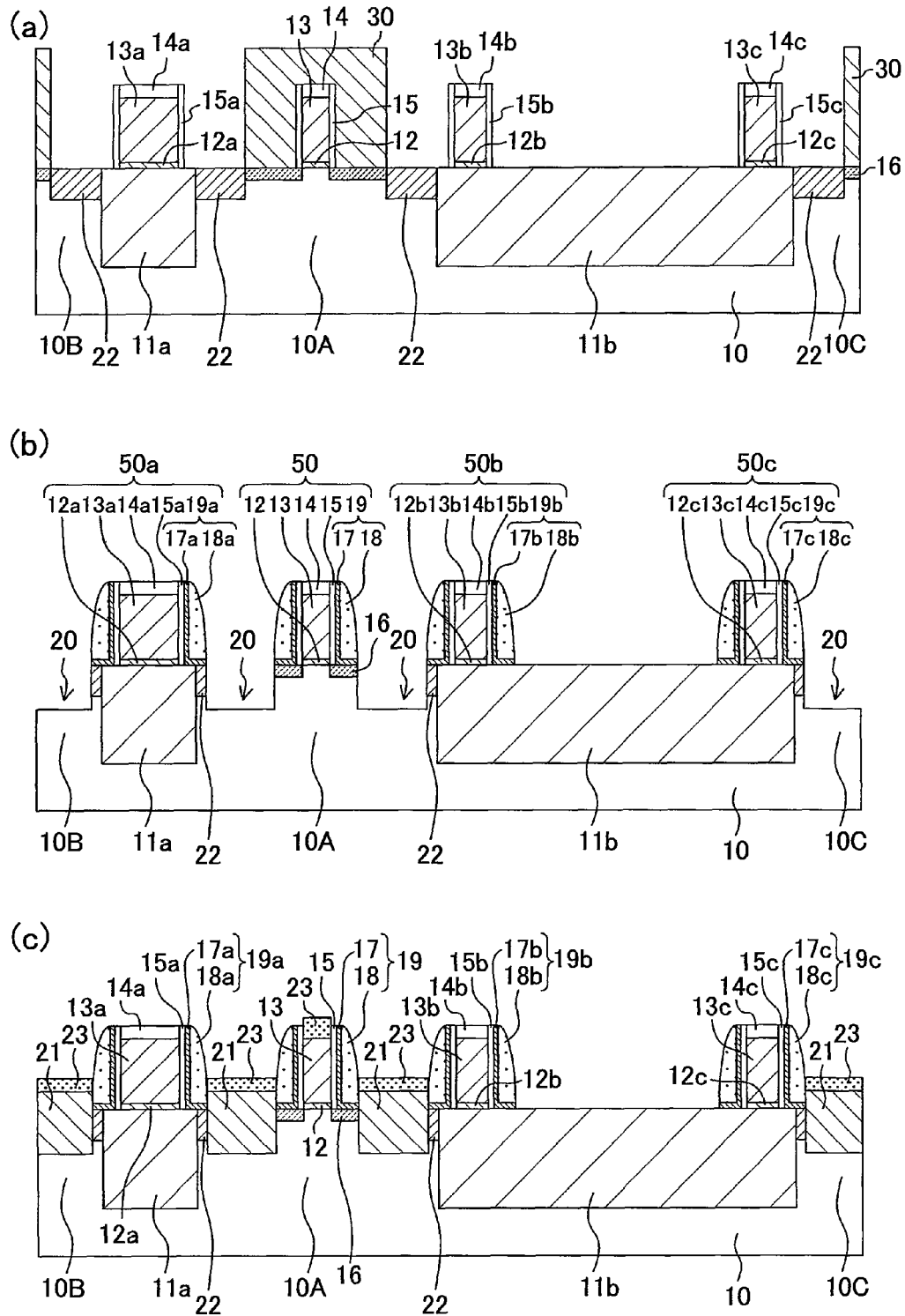
FIGS. 3(a) to 3(c) are cross-sectional views showing a method for fabricating a semiconductor device according to a first variation of the first embodiment of the present invention.

Hereinafter, a method for fabricating a semiconductor device according to a first variation of the first embodiment of the present invention will be described with reference to FIG. 3. FIGS. 3(a) to 3(c) are cross-sectional views showing the method for fabricating the semiconductor device of the first variation of the first embodiment. Note that, in FIG. 3, the same parts as those of FIGS. 1 and 2 are indicated by the same reference characters and will not be described in more detail.

Initially, as in the method for fabricating the semiconductor device of the first embodiment, the steps of FIGS. 1(a) and 1(b) are performed to obtain the structure of FIG. 1(b) in which the p-type extension regions 16 are formed.

Next, as shown in FIG. 3(a), a resist 30 is formed on the semiconductor substrate 10. The resist 30 covers a gate electrode 13, and a portion of trench portion formation regions in which trench portions are to be formed in a subsequent step, and has opening portions that expose regions that are end portions of active regions 10A, 10B and 10C and are adjacent to isolation regions 11a and 11b. Thereafter, a p-type impurity (e.g., boron) is implanted into the active regions 10A, 10B and 10C at a dose of $4 \times 10^{15}$ ions/cm$^2$ using the resist 30 as a mask. Next, the resist 30 is removed, followed by thermal processing for activating the implanted impurity, to form p-type impurity regions 22. The p-type impurity regions 22 are made of a semiconductor substrate 10, and need to be formed in regions between a p-type SiGe layer to be formed in a subsequent step and the isolation regions 11a and 11b.

Next, as shown in FIG. 3(b), sidewalls 19, 19a, 19b and 19c are formed in a manner similar to the step of FIG. 1(c). Thereafter, trench portions 20 are formed by etching exposed portions of the semiconductor substrate 10 to desired depths using, as a mask, a gate portion 50 having a gate insulating film 12, the gate electrode 13, a protective insulating film 14, offset spacers 15 and the sidewalls 19, a mask portion 50 having a dummy gate insulating film 12a, a dummy gate electrode 13a, a dummy protective insulating film 14a, offset spacers 15a and the sidewalls 19a, a mask portion 50b having a dummy gate insulating film 12b, a dummy gate electrode 13b, a dummy protective insulating film 14b, offset spacers 15b and the sidewalls 19b, and a mask portion 50c having a dummy gate insulating film 12c, a dummy gate electrode 13c, a dummy protective insulating film 14c, offset spacers 15c and the sidewalls 19c. In this case, since the semiconductor substrate 10 in which the p-type impurity regions 22 are formed is left between the isolation regions 11a and 11b and the trench portions 20, the isolation regions 11a and 11b are not exposed from surfaces of the trench portions 20, i.e., entire inner walls of the trench portions 20 are formed of the semiconductor substrate 10.

Next, as shown in FIG. 3(c), a p-type SiGe layer 21 is epitaxially grown by, for example, MOCVD to fill the trench portions 20. Note that, in the fabrication method of this variation, the p-type impurity regions 22 formed by ion implantation have junction depths shallower than a bottom surface of the p-type SiGe layer 21 formed in the trench portions 20. Next, the protective insulating film 14 provided on the gate electrode 13 is removed, and thereafter, a metal silicide layer 23 is formed on each of the gate electrode 13 and the p-type SiGe layer 21 that is to be source/drain regions. Thereafter, an interlayer insulating film, a contact plug, a metal wiring and the like (not shown) are formed on the semiconductor substrate 10, thereby completing fabrication of the semiconductor device of this variation.

In the method for fabricating the semiconductor device of this variation, when the trench portions 20 are formed, portions of the sidewalls 19a, 19b and 19c included in the mask portions 50a, 50b and 50c cover regions (substrate regions) that are end portions of the active regions and are adjacent to the isolation regions 11a and 11b, the substrate regions can be left between the trench portions 20 and the isolation regions 11a and 11b, as in the method for fabricating the semiconductor device of the first embodiment. As a result, entire inner walls of the trench portions 20 are formed of the semiconductor substrate, so that epitaxial growth can be satisfactorily performed, resulting in the p-type SiGe layer 21 having a desired characteristic. Therefore, according to the method for fabricating the semiconductor device of this variation, a semiconductor device that includes a p-type SiGe layer having a satisfactory characteristic and can operate at high speed can be fabricated.

Also, in the method for fabricating the semiconductor device of this variation, no p-type impurity region 22 is formed on sides closer to the gate electrode 13 of the p-type SiGe layer 21 (below the sidewalls 19), and the p-type impurity regions 22 are formed only in regions of the semiconductor substrate 10 between the p-type SiGe layer 21 and the isolation regions 11a and 11b. In this case, as compared to the semiconductor device of the first embodiment of FIG. 2(c), the short channel effect can be suppressed. As a result, with the method for fabricating the semiconductor device of this variation, the leakage current is suppressed, and in addition, the deterioration of a characteristic of the MIS transistor due to the short channel effect is reduced, so that a highly reliable semiconductor device can be achieved.

Also, in the method for fabricating the semiconductor device of this variation, the p-type impurity regions 22 are formed by ion implantation before the p-type SiGe layer 21 is formed. Therefore, as compared to when the p-type SiGe layer 21 is formed before a p-type impurity contained in the p-type SiGe layer 21 is diffused by thermal processing to form the p-type impurity regions as in the fabrication method of the first embodiment, the method for fabricating the semiconductor device of this variation can be used to relatively easily form the p-type impurity regions 22 having a high concentration by quick thermal processing.

(Second Variation of First Embodiment)

Figure 4:
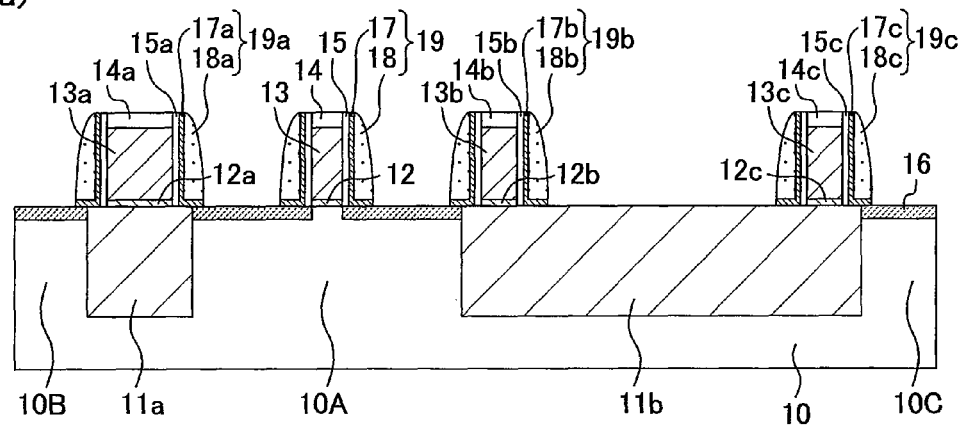
FIGS. 4(a) to 4(c) are cross-sectional views showing a method for fabricating a semiconductor device according to a second variation of the first embodiment of the present invention.
Figure 4:
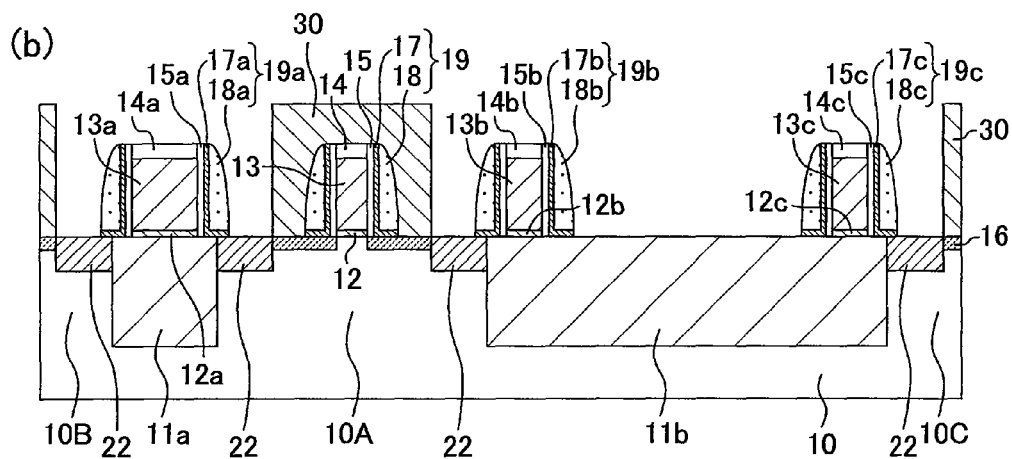
Figure 4:
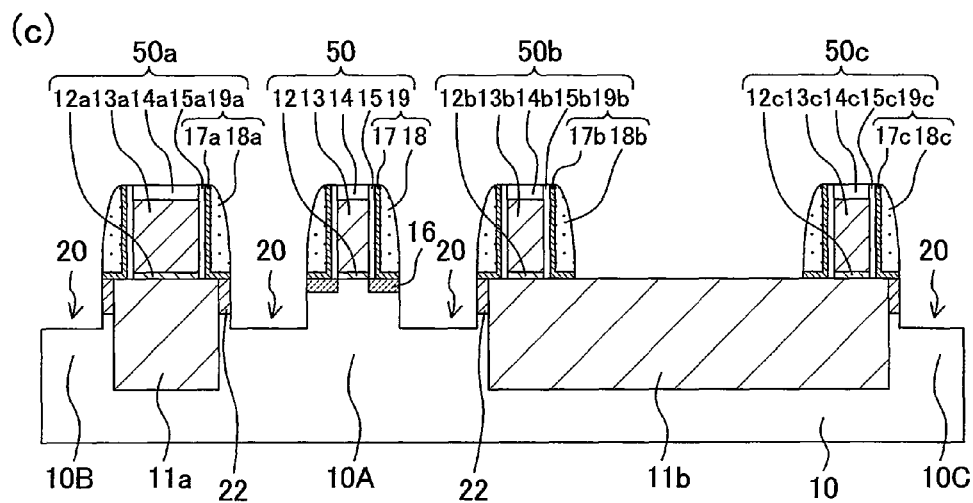

Hereinafter, a method for fabricating a semiconductor device according to a second variation of the first embodiment of the present invention will be described with reference to FIG. 4. FIGS. 4(a) to 4(c) show the method for fabricating the semiconductor device of the second variation. Note that, in FIG. 4, the same parts as those of FIGS. 1 and 2 are indicated by the same reference characters and will not be described in more detail.

Initially, as in the method for fabricating the semiconductor device of the first embodiment, the steps of FIGS. 1(a) and 1(b) are performed to obtain the structure of FIG. 1(b) in which p-type extension regions 16 are formed.

Next, as shown in FIG. 4(a), sidewalls 19 are formed on side surfaces of a gate electrode 13 with offset spacers 15 being interposed therebetween while sidewalls 19a, 19b and 19c are formed on side surfaces of dummy gate electrodes 13a, 13b and 13c with offset spacers 15a, 15b and 15c being interposed therebetween, in a manner similar to that in which the sidewalls of FIG. 1(c) are formed.

Next, as shown in FIG. 4(b), a resist 30 is formed on the semiconductor substrate 10. The resist 30 covers the gate electrode 13, the sidewalls 19, and a portion of trench portion formation regions in which trench portions are to be formed in a subsequent step, and has opening portions that expose regions (substrate region) that are end portions of active regions 10A, 10B and 10C and are adjacent to isolation regions 11a and 11b. Thereafter, a p-type impurity (e.g., boron) is implanted into the active regions 10A, 10B and 10C at a dose of $4 \times 10^{15}$ ions/cm$^2$ and at an implantation angle of 10° to 25° (angled ion implantation) using the resist 30 as a mask. Next, the resist 30 is removed, followed by thermal processing for activating the implanted impurity, to form p-type impurity regions 22. The p-type impurity regions 22 need to be formed in regions of the semiconductor substrate 10 between a p-type SiGe layer to be formed in a subsequent step, and the isolation regions 11a and 11b.

Next, as shown in FIG. 4(c), in a manner similar to that in which the trench portions 20 of FIG. 1(c) are formed, trench portions 20 are formed by etching exposed regions of the semiconductor substrate 10 to desired depths using, as a mask, a gate portion 50 having a gate insulating film 12, the gate electrode 13, a protective insulating film 14, the offset spacers 15 and the sidewalls 19, a mask portion 50a having a dummy gate insulating film 12a, a dummy gate electrode 13a, a dummy protective insulating film 14a, the offset spacers 15a and the sidewalls 19a, a mask portion 50b having a dummy gate insulating film 12b, a dummy gate electrode 13b, a dummy protective insulating film 14b, the offset spacers 15b and the sidewalls 19b, and a mask portion 50c having a dummy gate insulating film 12c, a dummy gate electrode 13c, a dummy protective insulating film 14c, the offset spacers 15c and the sidewalls 19c. In this case, since the semiconductor substrate 10 in which the p-type impurity regions 22 are formed is left between the isolation regions 11a and 11b and the trench portions 20, the isolation regions 11a and 11b are not exposed from surfaces of the trench portions 20, i.e., entire inner walls of the trench portions 20 are formed of the semiconductor substrate 10.

Next, a p-type SiGe layer 21 is epitaxially grown by, for example, MOCVD to fill the trench portions 20, though not shown. Next, the protective insulating film 14 provided on the gate electrode 13 is removed, and thereafter, a metal silicide layer 23 is formed on each of the gate electrode 13 and the p-type SiGe layer 21. Thereafter, an interlayer insulating film, a contact plug, a metal wiring and the like (not shown) are formed on the semiconductor substrate 10, thereby completing fabrication of the semiconductor device of this variation.

According to the semiconductor device of this variation and the fabrication method thereof, the substrate regions in which the p-type impurity regions 22 are formed are provided between the trench portions 20 and the isolation regions 11a and 11b in the step of FIG. 4(c). As a result, the entire inner walls of the trench portions 20 are formed of the semiconductor substrate 10, so that the p-type SiGe layer 21 can be epitaxially grown in the trench portions 20 in a satisfactorily controlled manner. Therefore, a semiconductor device including the p-type SiGe layer 21 having satisfactory quality can be achieved, resulting in an effect similar to that of the semiconductor devices of the first embodiment and its first variation and the fabrication methods thereof.

(Third Variation of First Embodiment)

Figure 5:
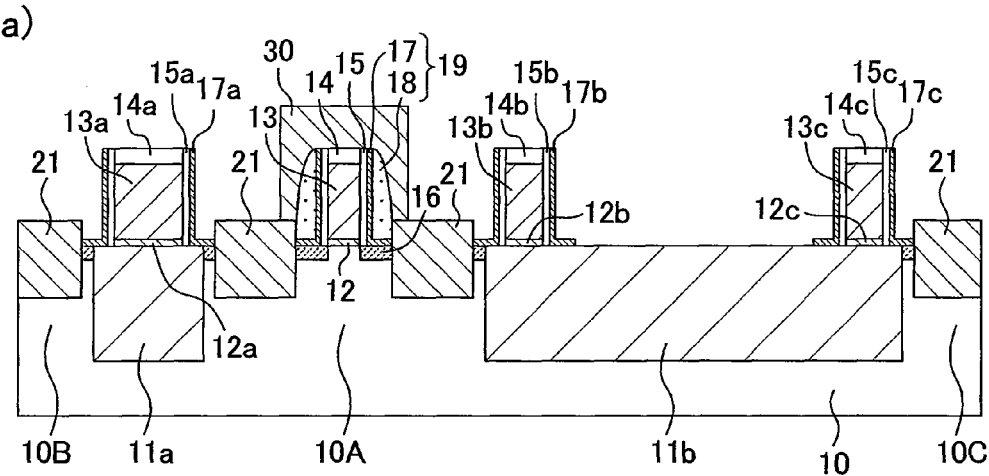
FIGS. 5(a) to 5(c) are cross-sectional views showing a method for fabricating a semiconductor device according to a third variation of the first embodiment of the present invention.
Figure 5:
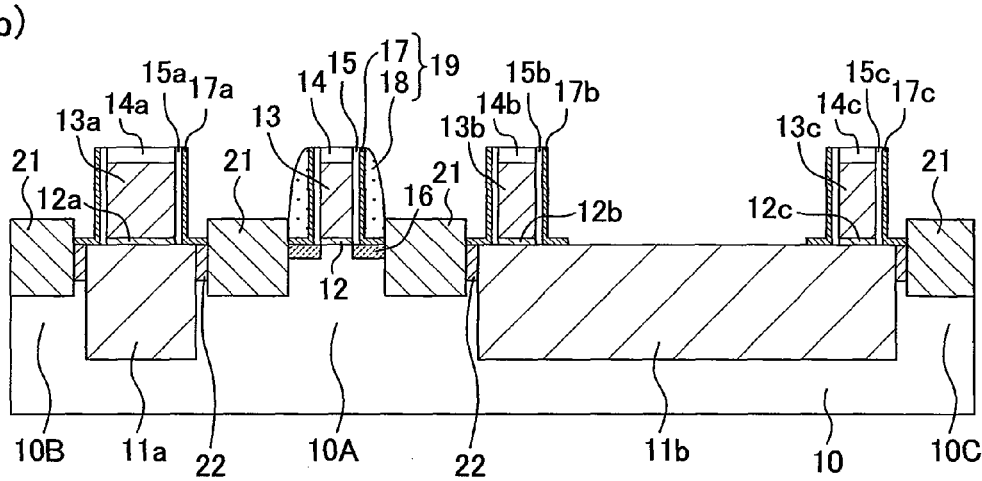
Figure 5:
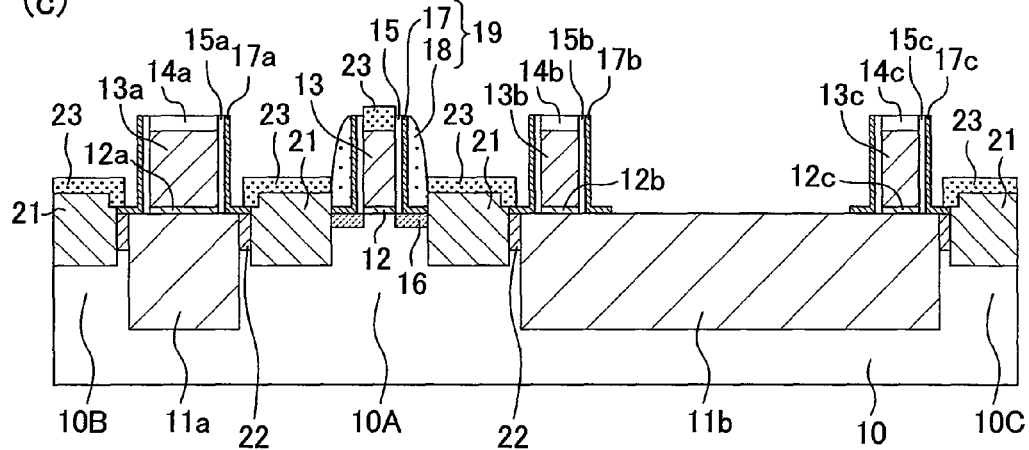

Hereinafter, a method for fabricating a semiconductor device according to a third variation of the first embodiment of the present invention will be described with reference to FIG. 5. FIGS. 5(a) to 5(c) show the method for fabricating the semiconductor device of the third variation. Note that, in FIG. 5, the same parts as those of FIGS. 1 and 2 are indicated by the same reference characters and will not be described in more detail.

Initially, a structure of FIG. 2(a) in which a p-type SiGe layer 21 is formed is obtained by successively performing the steps of FIGS. 1(a) to 1(c) and 2(a) in a manner similar to the method for fabricating the semiconductor device of the first embodiment.

Next, as shown in FIG. 5(a), a resist 30 is formed on the semiconductor substrate 10. The resist 30 covers a gate electrode 13, offset spacers 15, sidewalls 19, and a portion of the p-type SiGe layer 21. Thereafter, outer sidewalls 18a, 18b and 18c included in sidewalls 19a, 19b and 19c are removed using the resist 30 as a mask.

Next, as shown in FIG. 5(b), the resist 30 is removed, and thereafter, boron (p-type impurity) is implanted into active regions 10A, 10B and 10C at a dose of $4 \times 10^{15}$ ions/cm$^2$. Thereafter, thermal processing for activating the implanted p-type impurity is performed to form p-type impurity regions 22. Although the resist 30 is removed before boron ion implantation in this variation, boron ion implantation may be performed using the resist 30 as a mask to form the p-type impurity regions 22. Alternatively, after the resist 30 is removed, a resist covering the gate electrode 13, the offset spacers 15, the sidewalls 19 and a portion of the p-type SiGe layer 21 may be formed on the semiconductor substrate 10 again, and boron ion implantation may be performed using the resist as a mask to form the p-type impurity regions 22.

Next, as shown in FIG. 5(c), the protective insulating film 14 provided on the gate electrode 13 is removed, and thereafter, a metal silicide layer 23 is formed on each of the gate electrode 13 and the p-type SiGe layer 21. Thereafter, an interlayer insulating film, a contact plug, a metal wiring and the like (not shown) are formed on the semiconductor substrate 10, thereby completing fabrication of the semiconductor device of this variation.

According to the semiconductor device of this variation and the fabrication method thereof, substrate regions are provided between trench portions 20 and isolation regions 11a and 11b as in the first embodiment and its first and second variations. As a result, entire inner walls of the trench portions 20 are formed of the semiconductor substrate 10, so that the p-type SiGe layer 21 can be epitaxially grown in the trench portions 20 in a satisfactorily controlled manner in the step of FIG. 5(a). Therefore, a semiconductor device that includes the p-type SiGe layer 21 having satisfactory quality and can operate at high speed can be achieved.

Although the inner sidewalls 17a, 17b and 17c are left in the step of FIG. 5(a) in this variation, the inner sidewalls 17a, 17b and 17c do not necessarily need to be left. All of the inner sidewalls 17a, 17b and 17c may be removed, or a portion of the inner sidewalls 17a, 17b and 17c that contacts the semiconductor substrate 10 may be removed. In this case, a p-type impurity can be more easily implanted, so that the p-type impurity regions 22 can be more reliably formed.

Also, although the outer sidewalls 18 provided on the side surfaces of the gate electrode 13 are left in the step of FIG. 5(a) in this variation, the outer sidewalls 18 do not necessarily need to be left. The outer sidewalls 18 as well as the outer sidewalls 18a, 18b and 18c may be removed. In this case, in the step of FIG. 5(b), a resist covering the gate electrode 13, the offset spacers 15, the inner sidewalls 17 and a portion of the p-type SiGe layer 21 may be formed on the semiconductor substrate 10, and boron ion implantation may be performed using the resist as a mask to form the p-type impurity regions 22.

Note that, in the fabrication methods of the first embodiment and its variations, the protective insulating film 14 provided on the gate electrode 13 is provided so as to prevent epitaxial growth on the gate electrode 13 when the p-type SiGe layer 21 are formed. Therefore, the step of removing the protective insulating film 14 does not necessarily need to be performed immediately before the metal silicide layer 23 is formed. The protective insulating film 14 can be removed at any step after the p-type SiGe layer 21 is formed and before the metal silicide layer 23 is formed.

Second Embodiment

Figure 6:
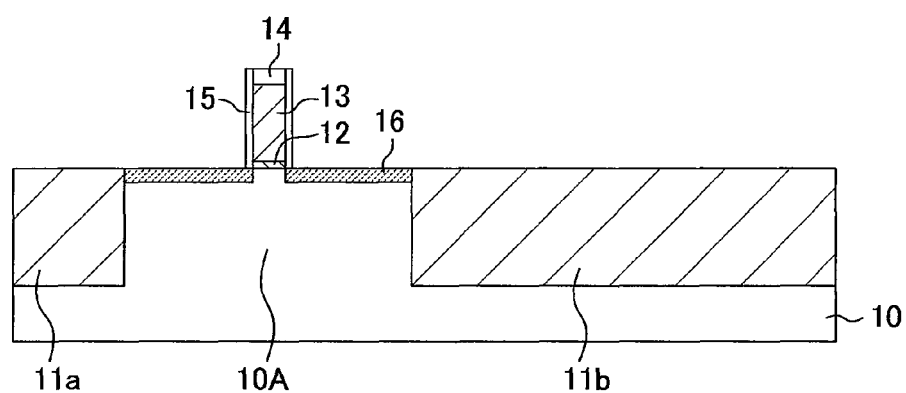
FIGS. 6(a) to 6(c) are cross-sectional views showing a method for fabricating a semiconductor device according to a second embodiment of the present invention.
Figure 6:
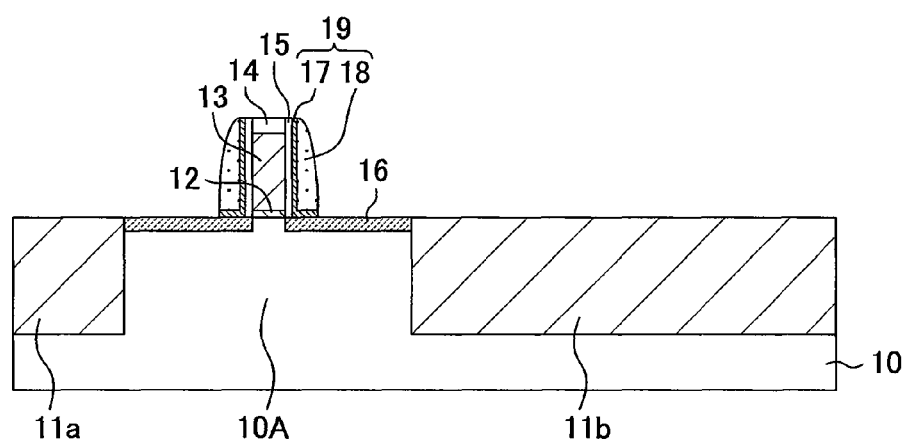
Figure 6:
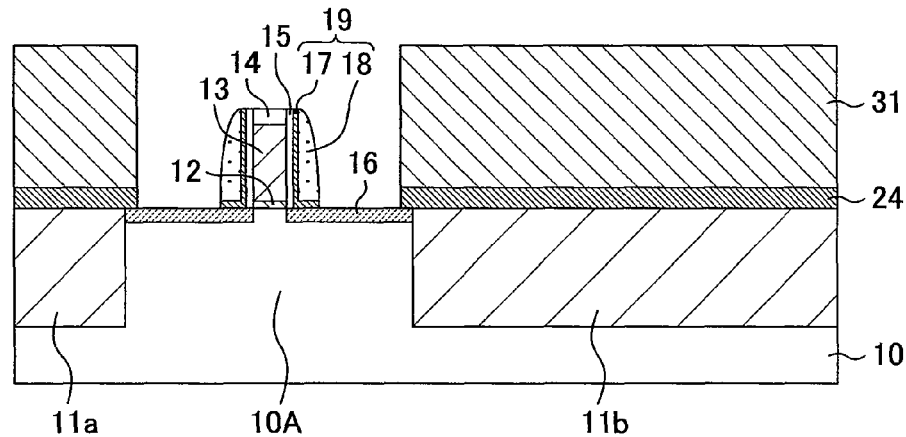
Figure 7:
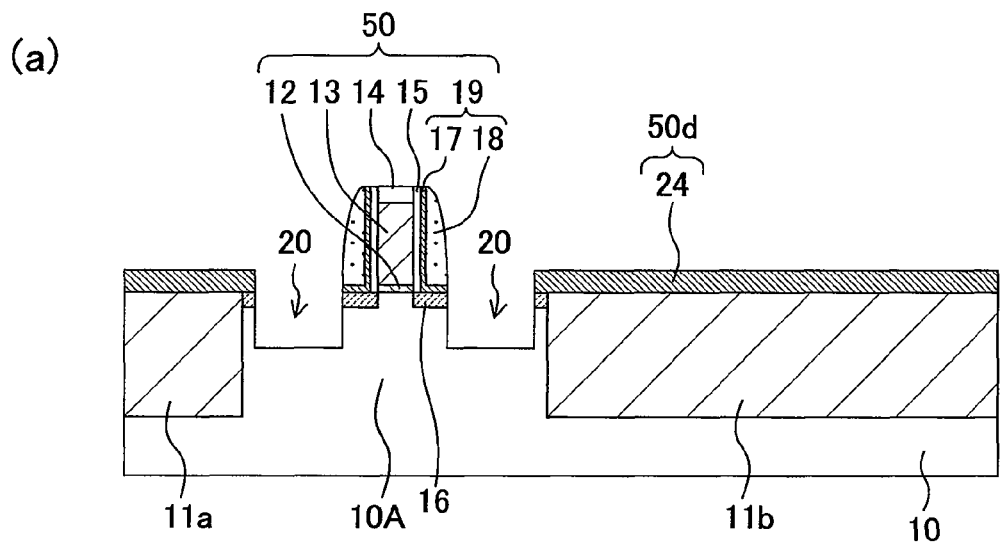
FIGS. 7(a) to 7(c) are cross-sectional views showing the method for fabricating the semiconductor device of the second embodiment of the present invention.
Figure 7:
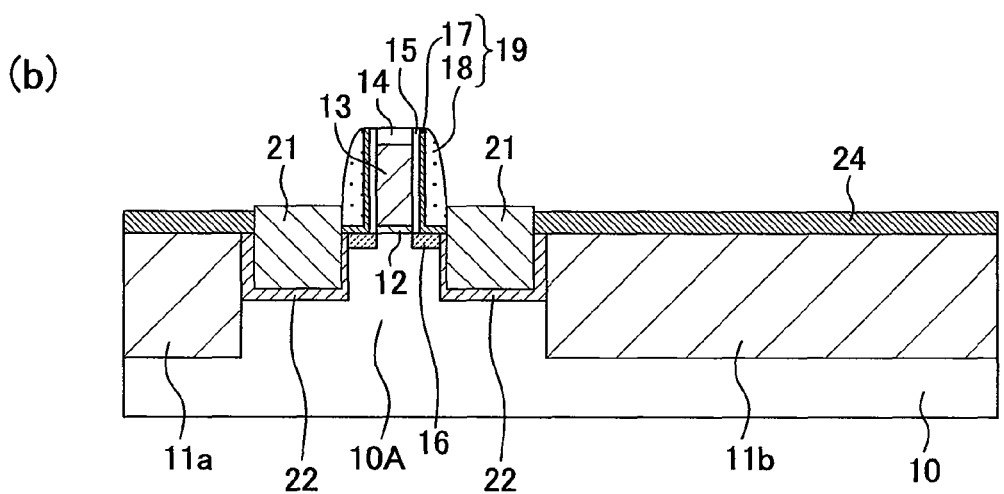
Figure 7:
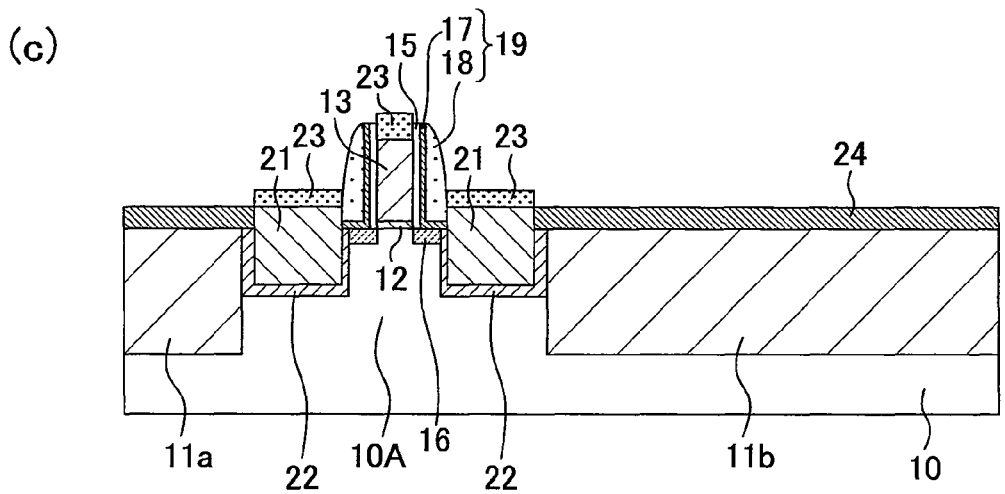

A method for fabricating a semiconductor device according to a second embodiment of the present invention will be described with reference to the drawings. FIGS. 6 and 7 are cross-sectional views showing the method for fabricating the semiconductor device of this embodiment. Note that the same parts as those of the first embodiment (FIGS. 1 and 2) are indicated by the same reference characters and will not be described in more detail.

Initially, as shown in FIG. 6(a), trenches are formed in an upper portion of a semiconductor substrate 10 made of silicon (Si) with a main surface having, for example, a (100) plane orientation by, for example, STI (Shallow Trench Isolation). The trenches are filled with an insulating film to selectively form isolation regions 11a and 11b. As a result, an active region 10A that is made of the semiconductor substrate 10 and is surrounded by the isolation regions 11a and 11b are formed.

Next, an n-type well region (not shown) is formed by implanting an n-type impurity, such as P (phosphorus) or the like, into the semiconductor substrate 10 by lithography and ion implantation. Thereafter, for example, a silicon oxynitride film having a film thickness of 2 nm, a polysilicon film having a film thickness of 100 nm, and a silicon oxide film of a film thickness of 30 nm are successively formed on an entire surface of the semiconductor substrate 10. Thereafter, the silicon oxide film, the polysilicon film and the silicon oxynitride film are successively subjected to patterning by photolithography and dry etching to form on the active region 10A a gate insulating film 12 made of the silicon oxynitride film, a gate electrode 13 made of the polysilicon film, and a protective insulating film 14 made of the silicon oxide film.

Next, a silicon oxide film having a film thickness of 5 nm is formed on an entire surface of the semiconductor substrate 10, and thereafter, the silicon oxide film is etched back, to form offset spacers 15 having I-shaped cross-sections on side surfaces of the gate electrode 13. Thereafter, boron (p-type impurity) is implanted into the active region 10A at a dose of $4 \times 10^{14}$ ions/cm² using the gate electrode 13 and the offset spacers 15 as a mask, to form p-type extension regions 16.

Next, as shown in FIG. 6(b), for example, a silicon oxide film having a film thickness of 5 nm and a silicon nitride film having a film thickness of 30 nm are successively deposited by, for example, CVD (Chemical Vapor Deposition), and thereafter, the multilayer film of the silicon oxide film and the silicon nitride film is etched back. As a result, sidewalls 19 are formed on side surfaces of the gate electrode 13 with the offset spacers 15 being interposed therebetween. Here, the sidewall 19 includes an inner sidewall 17 that is made of the silicon oxide film and has an L-shaped cross-section, and an outer sidewall 18 that is made of the silicon nitride film formed on the L-shaped inner sidewall 17.

Next, as shown in FIG. 6(c), a protective film 24 made of, for example, a silicon oxide film having a film thickness of 30 nm is deposited on an entire surface of the semiconductor substrate 10 by, for example, CVD. Thereafter, a resist 31 is formed on the protective film 24. The resist 31 has an opening portion for exposing regions of the protective film 24 provided on the gate electrode 13, the sidewalls 19, and trench portion formation regions where trench portions are to be formed in a subsequent step, and covers portions of the protective film 24 provided on the isolation regions 11a and 11b, and regions extending from boundaries between the isolation regions 11a and 11b and the active region 10A toward the inside of the active region 110A by a predetermined distance. Next, the protective film 24 is etched using the resist 31 as a mask. As a result, the protective film 24 has an opening portion exposing the trench portion formation regions and covers boundary regions (substrate regions) that are end portions of the active region 10A and are located between the active region 10A and the isolation regions 11a and 11b. Although the resist 31 is formed to cover entire surfaces of the isolation regions 11a and 11b in this embodiment, the resist 31 does not necessarily need to be formed on the isolation regions 11a and 11b if the resist 31 has an opening portion at a predetermined position and covers the protective film 24 formed above the substrate regions.

Next, as shown in FIG. 7(a), the resist 31 is removed, and thereafter, exposed portions of the semiconductor substrate 10 are etched to desired depths using, as a mask, a gate portion 50 having the gate insulating film 12, the gate electrode 13, the protective insulating film 14, the offset spacers 15 and the sidewalls 19, and a mask portion 50d having the protective film 24. As a result, trench portions 20 are formed in regions (trench portion formation regions) located between the sidewalls 19 and the protective film 24 of the active region 10A. In this case, since the protective film 24 is formed on the regions (substrate regions) that are end portions of the active region 10A and are adjacent to the isolation regions 11a and 11b, the semiconductor substrate 10 is left between the isolation regions 11a and 11b and the trench portions 20. As a result, entire inner walls of the trench portions 20 are formed of the semiconductor substrate 10 without the isolation regions 11a and 11b being exposed to the inside of the trench portions 20.

Next, a p-type SiGe layer 21 is epitaxially grown to fill the trench portions 20 by supplying, for example, silane gas ($SiH_4$) and germane gas ($GeH_4$) along with p-type dopant gas, such as diborane ($B_2H_6$) or the like, by, for example, MOCVD (Metal Organic Chemical Vapor Deposition) at a temperature of 650 to 700° C. In this case, an upper surface of the p-type SiGe layer 21 desirably has a height higher than or substantially equal to a height of an upper surface of the semiconductor substrate 10 immediately below the gate electrode 13. In this case, the p-type SiGe layer 21 applies sufficient stress to a channel region formed below the gate electrode 13, so that the drive capability of the p-type MIS transistor can be further enhanced.

Next, the semiconductor substrate 10 is subjected to thermal processing so that the p-type impurity in the p-type SiGe layer 21 is diffused into the semiconductor substrate 10. As a result, p-type impurity regions 22 are formed in regions (substrate regions) located between the isolation regions 11a and 11b and the p-type SiGe layer 21 in the active region 10A. By this step, p-type source/drain regions including the p-type SiGe layer 21 and the p-type impurity regions 22 are formed in regions each of which is located outside and below the corresponding sidewall 19.

Here, in the aforementioned step, after the p-type SiGe layer 21 are formed, a p-type impurity (e.g., boron) may be implanted into the active region 10A including the p-type SiGe layer 21 at a dose of $4\times10^{15}$ ions/cm$^2$ and at an implantation angle of 10° to 25° using the gate electrode 13 and the sidewalls 19 as a mask, followed by thermal processing, to form the p-type impurity regions 22. In this case, as compared to when only the p-type impurity in the p-type SiGe layer 21 is diffused to form the p-type impurity regions 22, the p-type impurity regions 22 having a high concentration can be reliably formed in the substrate regions by quick thermal processing.

Next, as shown in FIG. 7(c), the protective insulating film 14 provided on the gate electrode 13 is removed, and thereafter, a metal film made of, for example, nickel (Ni), cobalt (Co), platinum (Pt) or the like is deposited on the semiconductor substrate 10 by sputtering or the like. Thereafter, the deposited metal film is subjected to annealing to form a metal silicide layer 23 on each of the gate electrode 13 and the p-type SiGe layer 21. Here, if the p-type SiGe layer 21 is already formed, the protective film 24 may be removed and a metal silicide layer 23 may also be formed on the p-type impurity regions 22. Next, an interlayer insulating film, a contact plug, a metal wiring and the like (not shown) are formed on the semiconductor substrate 10, thereby completing fabrication of the semiconductor device of this embodiment.

The method for fabricating the semiconductor device of this embodiment is characterized in that the trench portions 20 are formed using the gate portion 50 and the mask portion 50d in the step of FIG. 7(a). With this method, a portion of the protective film 24 forming the mask portion 50d covers the regions (substrate regions) that are end portions of the active region and are adjacent to the isolation regions 11a and 11b, so that the substrate regions can be left between the trench portions 20 and the isolation regions 11a and 11b. As a result, entire inner walls of the trench portions 20 are formed of the semiconductor substrate, so that epitaxial growth can be satisfactorily performed, resulting in the p-type SiGe layer 21 having a desired characteristic. Therefore, according to the method for fabricating the semiconductor device of this embodiment, a semiconductor device that includes a p-type SiGe layer having a satisfactory characteristic and can operate at high speed can be fabricated.

(Variation of Second Embodiment)

Figure 8:
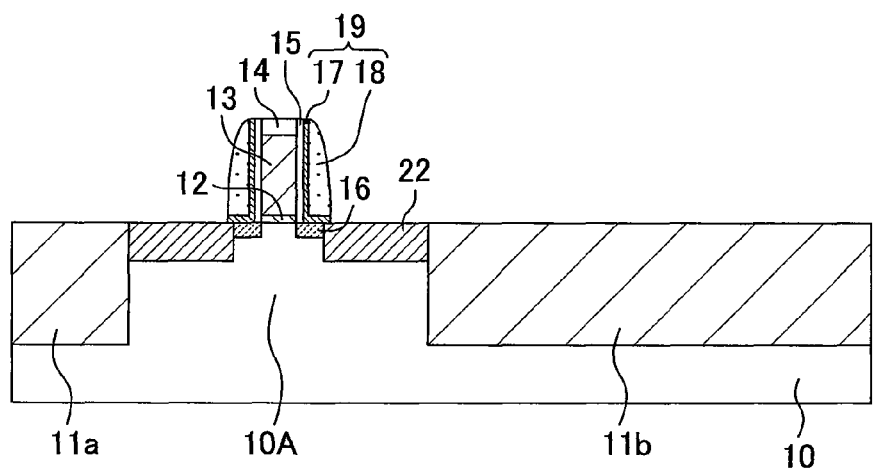
FIGS. 8(a) to 8(c) are cross-sectional views showing a method for fabricating a semiconductor device according to a variation of the second embodiment of the present invention.
Figure 8:
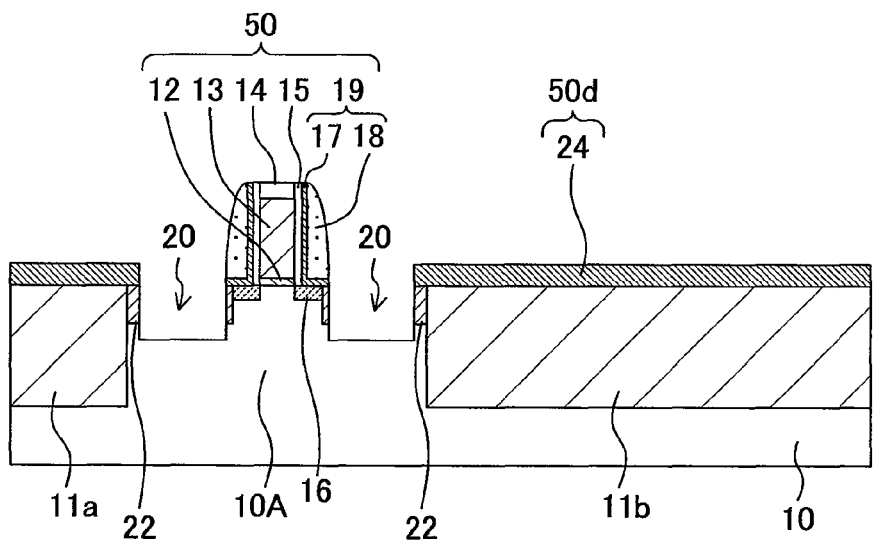
Figure 8:
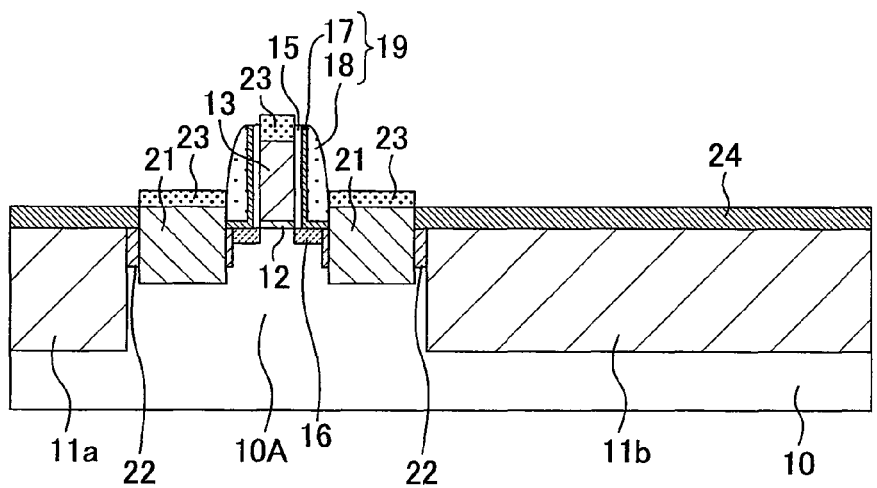

Hereinafter, a method for fabricating a semiconductor device according to a variation of the second embodiment of the present invention will be described with reference to FIG. 8. FIGS. 8(a) to 8(c) are cross-sectional views showing the method for fabricating the semiconductor device of the variation of this embodiment. Note that, in FIG. 8, the same parts as those of FIGS. 6 and 7 are indicated by the same reference characters and will not be described in more detail.

Initially, as in the method for fabricating the semiconductor device of the second embodiment, the steps of FIGS. 6(a) and 6(b) are performed to obtain the structure of FIG. 6(b) in which sidewalls 19 are formed.

Next, as shown in FIG. 8(a), boron (p-type impurity) is implanted into an active region 10A at a dose of $4\times10^{14}$ ions/cm$^2$ using a gate electrode 13, offset spacers 15 and the sidewalls 19 as a mask, followed by thermal processing, to form p-type impurity regions 22.

Next, as shown in FIG. 8(b), in a manner similar to that of FIGS. 6(c) and 7(a), a protective film 24 is formed on the isolation regions 11a and 11b and portions of the p-type impurity regions 22. The protective film 24 has an opening portion exposing trench portion formation regions and covers boundary regions (substrate regions) that are end portions of the active region and are located between the active region and the isolation regions 11a and 11b. Thereafter, trench portions 20 are formed by etching exposed portions of a semiconductor substrate 10 to desired depths using as a mask a gate portion 50 having a gate insulating film 12, a gate electrode 13, a protective insulating film 14 and the sidewalls 19, and a mask portion 50d having a protective film 24.

Next, as shown in FIG. 8(c), a p-type SiGe layer 21 is epitaxially grown by, for example, MOCVD to fill the trench portions 20, though not shown. Thereafter, the protective insulating film 14 provided on the gate electrode 13 is removed, and thereafter, a metal silicide layer 23 is formed on each of the gate electrode 13 and the p-type SiGe layer 21 that is to be source/drain regions. Here, if the p-type SiGe layer 21 is already formed, the protective film 24 may be removed and a metal silicide layer 23 may also be formed on the p-type impurity regions 22. Next, an interlayer insulating film, a contact plug, a metal wiring and the like (not shown) are formed on the semiconductor substrate 10, thereby completing fabrication of the semiconductor device of this embodiment.

In the fabrication method of this variation, the trench portions 20 are formed using the gate portion 50 and the mask portion 50d in the step of FIG. 8(b) in a manner similar to the fabrication method of the second embodiment. According to this method, portions of the protective film 24 forming the mask portion 50d cover regions (substrate regions) that are end portions of the active region and are adjacent to the isolation regions 11a and 11b. Therefore, the substrate regions can be left between the trench portions 20 and the isolation regions 11a and 11b. As a result, entire inner walls of the trench portions 20 are formed of the semiconductor substrate, so that epitaxial growth can be satisfactorily performed to obtain the p-type SiGe layer 21 having a desired characteristic. Therefore, according to the fabrication method of this variation, a semiconductor device that includes the p-type SiGe layer 21 having satisfactory quality and can operate at high speed can be achieved.

Although the p-type impurity regions 22 are formed using the gate electrode 13 and the sidewalls 19 as a mask in the step of FIG. 8(a) of the fabrication method of this embodiment, the p-type impurity regions 22 may be formed in a manner similar to that of the first to third variations of the first embodiment. Specifically, as in the step of FIG. 3(a) of the first variation of the first embodiment, the p-type impurity regions 22 may be formed using as an implantation mask a resist covering the gate electrode 13, the offset spacer 15 and portions of the trench portion formation regions after the step of FIG. 6(a) and before the step of FIG. 6(b). Also, as in the step of FIG. 4(b) of the second variation of the first embodiment, the p-type impurity regions 22 may be formed using as an implantation mask a resist covering the gate electrode 13, the offset spacers 15, the sidewalls 19 and portions of the trench portion formation regions after the step of FIG. 6(b) and before the step of FIG. 7(a), preferably before the step of FIG. 6(c). Alternatively, as in the steps of FIGS. 5(a) and 5(b) of the third variation of the first embodiment, the p-type impurity regions 22 may be formed on the semiconductor substrate 10 using as an implantation mask a resist covering the gate electrode 13, the offset spacers 15, the sidewalls 19 and a portion of the p-type SiGe layer 21 after the p-type SiGe layer 21 is formed in the step of FIG. 7(b) and before the step of FIG. 7(c). With these methods, an effect similar to that of the fabrication method of this embodiment can also be obtained.

Third Embodiment

Figure 9:
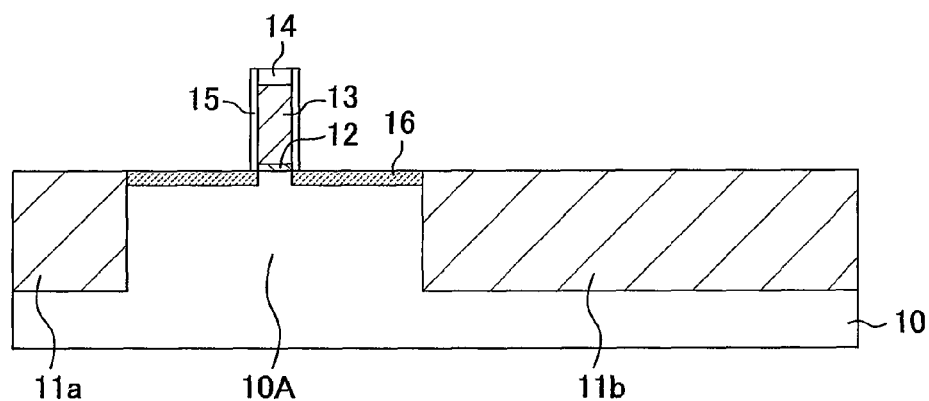
FIGS. 9(a) to 9(c) are cross-sectional views showing a method for fabricating a semiconductor device according to a third embodiment of the present invention.
Figure 9:
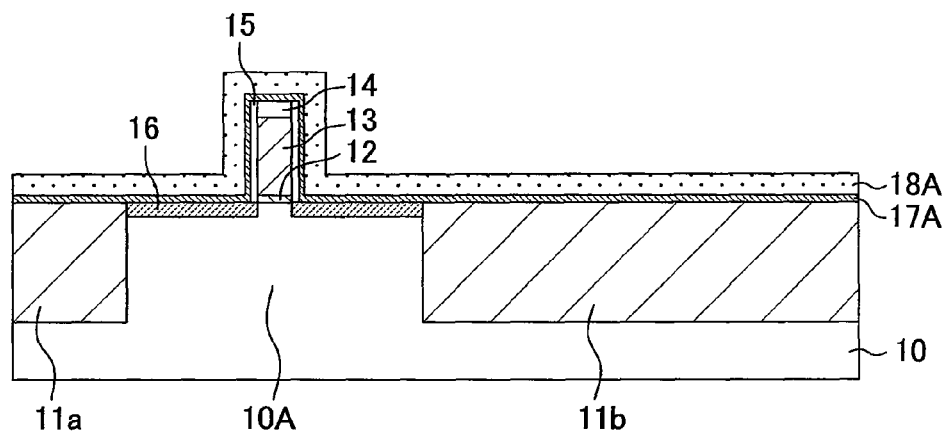
Figure 9:
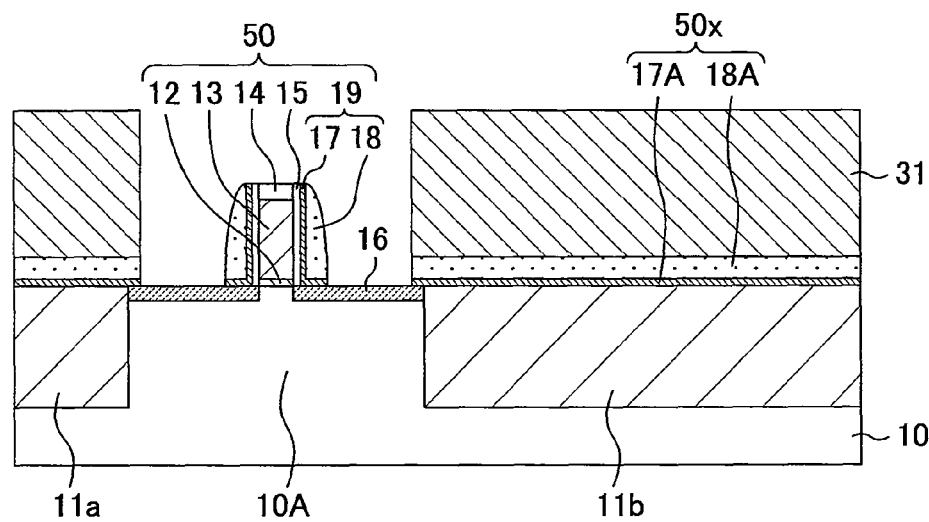
Figure 10:
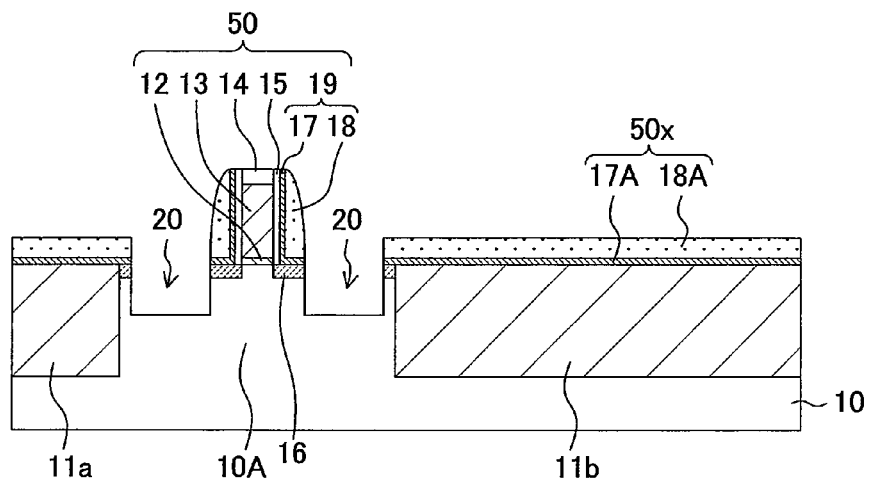
FIGS. 10(a) to 10(c) are cross-sectional views showing the method for fabricating the semiconductor device of the third embodiment of the present invention.
Figure 10:
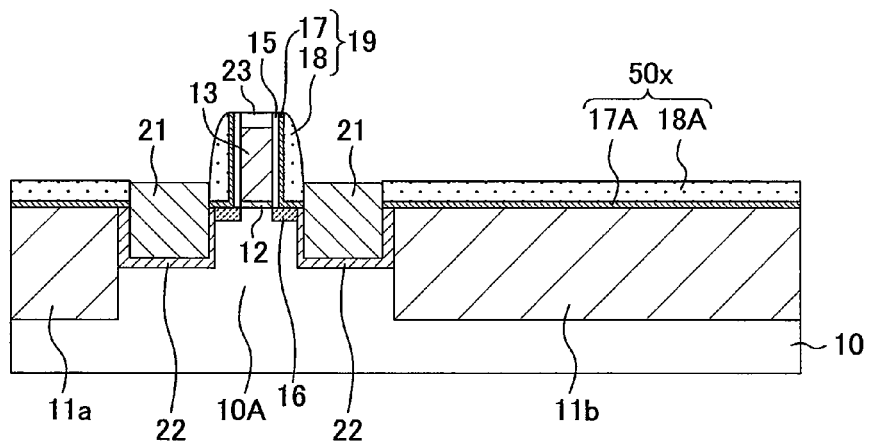
Figure 10:
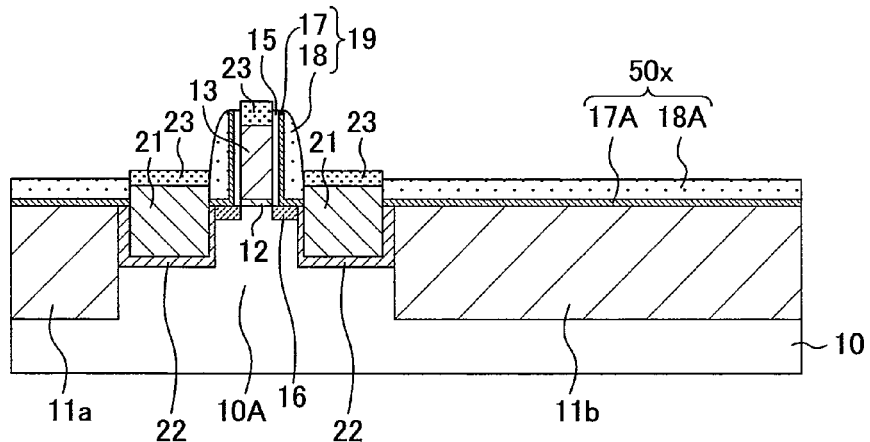

A method for fabricating a semiconductor device according to a third embodiment of the present invention will be described with reference to the drawings. FIGS. 9 and 10 are cross-sectional views showing the method for fabricating the semiconductor device of this embodiment. Note that the same parts as those of the first embodiment (FIGS. 1 and 2) are indicated by the same reference characters and will not be described in more detail.

Initially, as shown in FIG. 9(a), a gate insulating film 12, a gate electrode 13 and a protective insulating film 14 are formed on an active region 10A surrounded by isolation regions 11a and 11b in a semiconductor substrate 10 in a manner similar to the step of FIG. 6(a) in the second embodiment. Next, offset spacers 15 are formed on side surfaces of the gate electrode 13, and thereafter, p-type extension regions 16 are formed in regions on sides of the gate electrode 13 of the active region 10A.

Next, as shown in FIG. 9(b), for example, a first insulating film 17A made of a silicon oxide film having a film thickness of 5 nm and a second insulating film 18A made of a silicon nitride film having a film thickness of 30 nm are successively deposited on an entire surface of the semiconductor substrate 10 by, for example, CVD.

Next, as shown in FIG. 9(c), a resist 31 is formed on the second insulating film 18A. The resist 31 has an opening portion for exposing regions of the second insulating film 18A provided on the gate electrode 13, sidewalls 19, and trench portion formation regions where trench portions are to be formed in a subsequent step, and covers portions of the second insulating film 18A provided on the isolation regions 11a and 11b, and regions extending from boundaries between the isolation regions 11a and 11b and the active region 10A toward the inside of the active region 10A by a predetermined distance. Thereafter, the second insulating film 18A and the first insulating film 17A are successively etched using the resist 31 as a mask. As a result, sidewalls 19 are formed on side surfaces of the gate electrode 13 with offset spacers 15 being interposed therebetween. In addition, a mask portion 50x made of the first insulating film 17A and the second insulating film 18A is formed, covering the isolation regions 11a and 11b, and boundary regions (substrate region) that are end portions of the active region 10A and are located between the active region 10A and the isolation regions 11a and 11b.

Next, as shown in FIG. 10(a), the resist 31 is removed, and thereafter, exposed regions of the semiconductor substrate 10 are etched to desired depths using as a mask a gate portion 50 having the gate insulating film 12, the gate electrode 13, the protective insulating film 14, the offset spacers 15 and the sidewalls 19, and the mask portion 50x having the first insulating film 17A and the second insulating film 18A. As a result, trench portions 20 are formed in regions (trench portion formation regions) of the active region 10A located between the sidewalls 19 and the mask portion 50x (the first insulating film 17A and the second insulating film 18A) as viewed in the top. In this case, the mask portion 50x is formed on the regions (substrate regions) that are end portions of the active region 10A and are adjacent to the isolation regions 11a and 11b. Therefore, the semiconductor substrate 10 is left between the isolation region 11a and the trench portion 20 and between the isolation region 11b and trench portion 20. Therefore, entire inner walls of the trench portions 20 are formed of the semiconductor substrate 10 without the isolation regions 11a and 11b being exposed to the inside of the trench portions 20.

Next, as shown in FIG. 10(b), a p-type SiGe layer 21 is epitaxially grown to fill the trench portions 20 in a manner similar to the step of FIG. 7(b) of the second embodiment. Thereafter, the semiconductor substrate 10 is subjected to thermal processing so that a p-type impurity in the p-type SiGe layer 21 is diffused into the semiconductor substrate 10. As a result, p-type impurity regions 22 are formed in a region of the active region 10A located between the isolation region 11a and the p-type SiGe layer 21 and in a region of the active region 10A located between the isolation region 11b and the p-type SiGe layer 21. In this case, boron (p-type impurity) may be implanted into the active region 10A including the p-type SiGe layer 21 using the gate electrode 13 and the sidewalls 19 as a mask before thermal processing is performed to form the p-type impurity regions 22. In this case, the p-type impurity region 22 having a high concentration can be relatively easily formed by quick thermal processing Next, as shown in FIG. 10(c), the protective insulating film 14 provided on the gate electrode 13 is removed, and thereafter, a metal film made of, for example, nickel (Ni), cobalt (Co), platinum (Pt) or the like is deposited on the semiconductor substrate 10 by sputtering or the like. Thereafter, the deposited metal film is subjected to annealing to form a metal silicide layer 23 on each of the gate electrode 13 and the p-type SiGe layer 21. Thereafter, an interlayer insulating film, a contact plug, a metal wiring and the like (not shown) are formed on the semiconductor substrate 10, thereby completing fabrication of the semiconductor device of this embodiment.

The method for fabricating the semiconductor device of this embodiment is characterized in that the trench portions 20 are formed using the mask portion 50x as in the method for fabricating the semiconductor device of the second embodiment. As a result, the trench portions 20 are formed without the isolation regions 11a and 11b being exposed. Therefore, the p-type SiGe layer 21 can be epitaxially grown in the trench portions 20 in a satisfactorily controlled manner. Also, in the method for fabricating the semiconductor device of this embodiment, the mask portion 50x is formed in the same step that forms the sidewalls 19 of the MIS transistor. Therefore, a semiconductor device that includes the p-type SiGe layer 21 having satisfactory quality and can operate at high speed can be relatively easily fabricated without using a complicated step.

Although the p-type impurity regions 22 are formed by diffusion of an impurity contained in the p-type SiGe layer 21 or p-type impurity ion implantation in the step of FIG. 10(b) of the fabrication method of this embodiment, the p-type impurity regions 22 may be formed in a manner similar to the fabrication methods of the first to third variations of the first embodiment.

Fourth Embodiment

Figure 11:
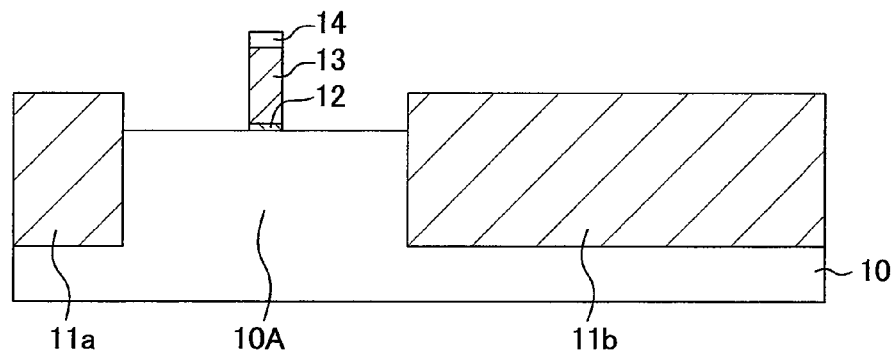
FIGS. 11(a) to 11(c) are cross-sectional views showing a method for fabricating a semiconductor device according to a fourth embodiment of the present invention.
Figure 11:
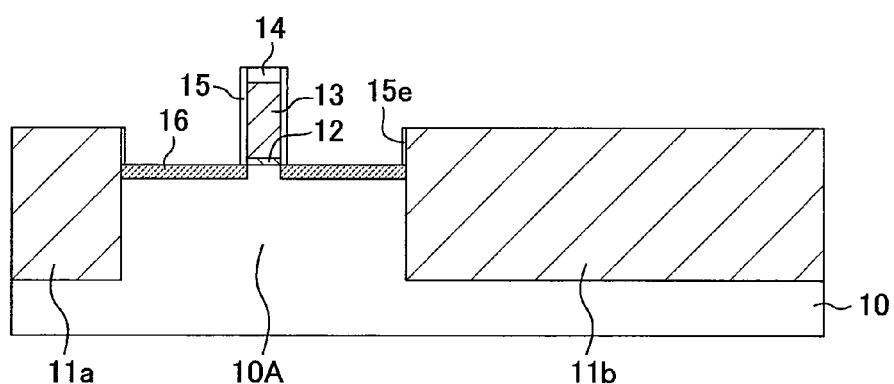
Figure 11:
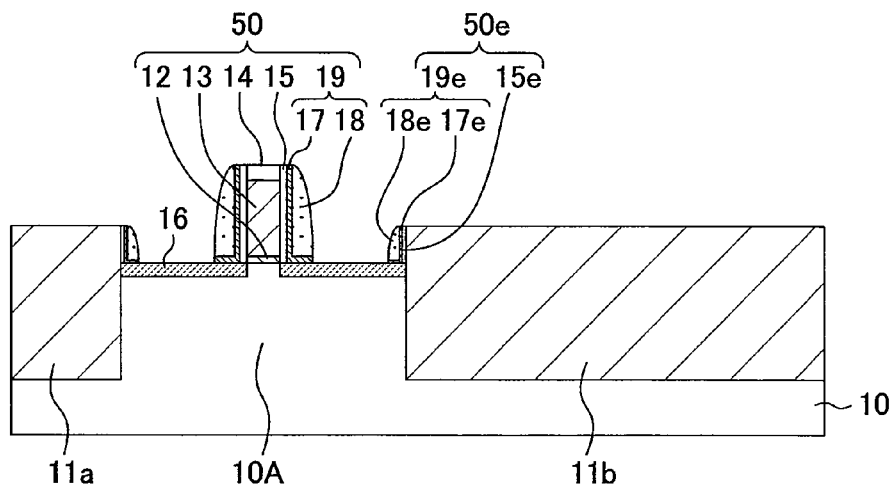
Figure 12:
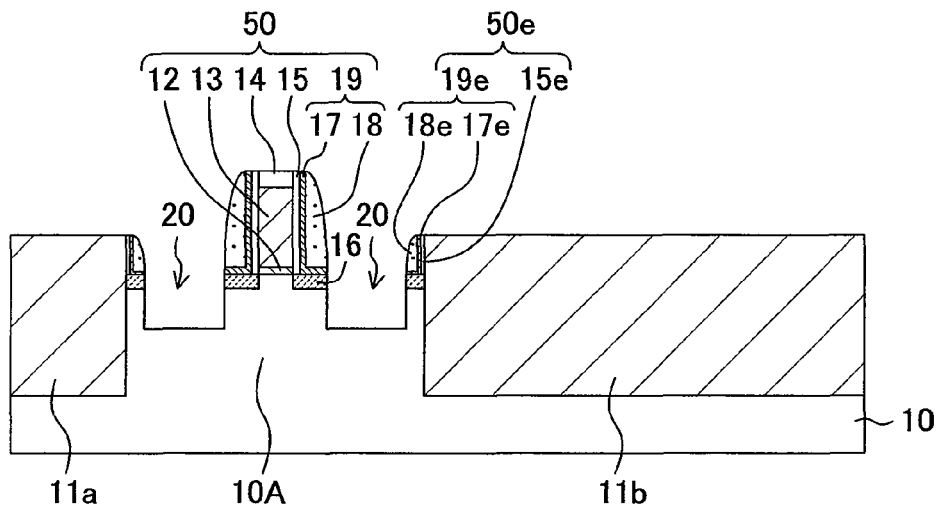
FIGS. 12(a) to 12(c) are cross-sectional views showing the method for fabricating the semiconductor device of the fourth embodiment of the present invention.
Figure 12:
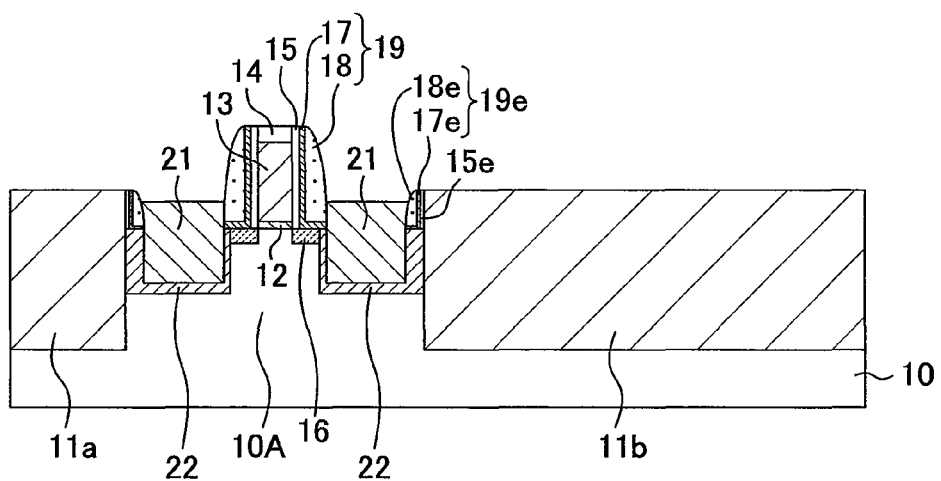
Figure 12:
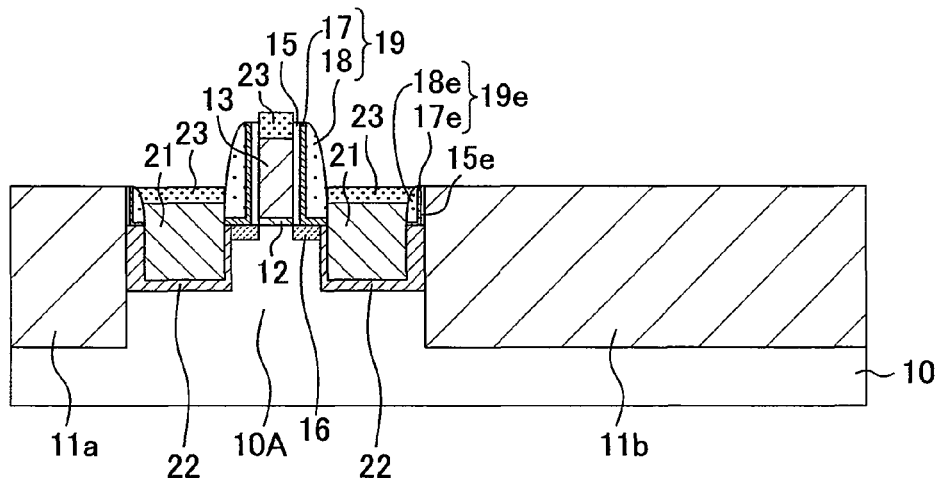
Figure 13:
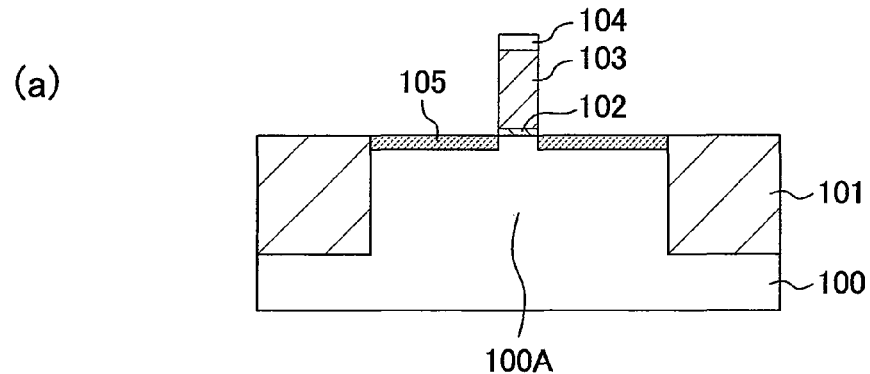
FIGS. 13(a) to 13(c) are cross-sectional views showing a method for fabricating a conventional semiconductor device.
Figure 13:
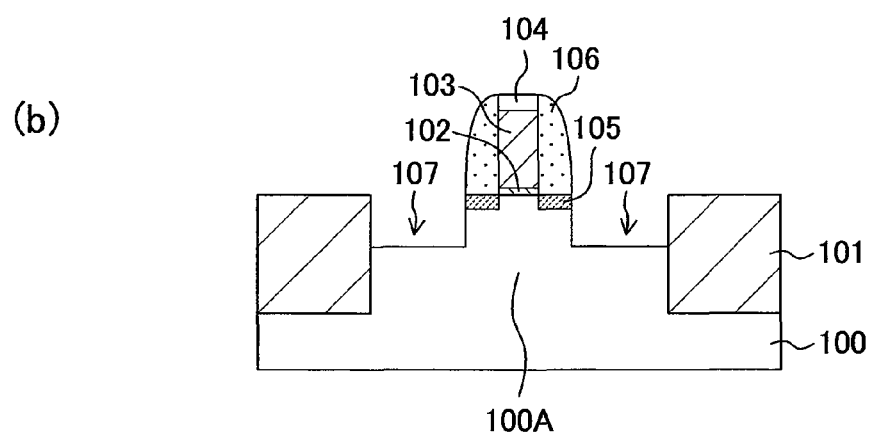
Figure 13:
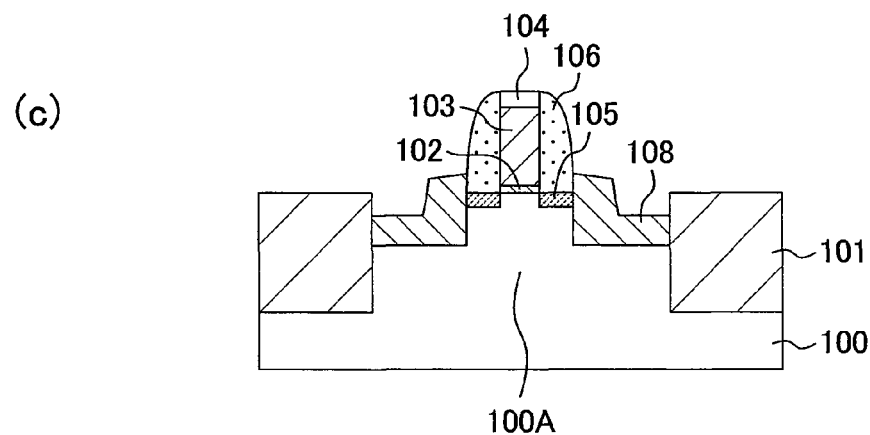

A method for fabricating a semiconductor device according to a fourth embodiment of the present invention will be described with reference to the drawings. FIGS. 11 and 12 are cross-sectional views showing the method for fabricating the semiconductor device of this embodiment. Note that the same parts as those of the first embodiment (FIGS. 1 and 2) are indicated by the same reference characters and will not be described in more detail.

Initially, as shown in FIG. 11(a), trenches are formed in an upper portion of a semiconductor substrate 10 made of silicon (Si) having a main surface having, for example, a (100) plane orientation by, for example, STI, and the trenches are filled with an insulating film to selectively form isolation regions 11a and 11b. As a result, an active region 10A made of the semiconductor substrate 10 surrounded by the isolation regions 11a and 11b is formed. In this case, the isolation regions 11a and 11b are formed so that upper surfaces of the isolation regions 11a and 11b are higher by, for example, about 30 nm than an upper surface of the active region 10A. As a result, step-like portions are provided at boundaries between the active region 10A and the isolation regions 11a and 11b. In this case, for example, while a protective film that is made of a silicon oxide film and a silicon nitride film and has a film thickness of 50 nm is formed on the active region 10A, the trenches are filled with an insulating film by CMP. Thereafter, the protective film on the active region 10A is removed, so that desired step-like portions can be provided at boundaries between the active region 10A and the isolation regions 11a and 11b. Alternatively, after the isolation regions 11a and 11b are formed, an upper portion of the active region 10A may be etched to provide desired step-like portions at boundaries between the active region 10A and the isolation regions 11a and 11b. Next, an n-type well region (not shown) is formed, and thereafter, a gate insulating film 12 made of a silicon oxynitride film, a gate electrode 13 made of a polysilicon film, and a protective insulating film 14 made of a silicon oxide film are formed on the active region 10A.

Next, as shown in FIG. 11(b), a silicon oxide film is formed on an entire surface of the semiconductor substrate 10, and thereafter, the silicon oxide film is etched back to form offset spacers 15 having an I-shaped cross-section on side surfaces of the gate electrode 13, and offset spacers 15e having an I-shaped cross-section on side surfaces of the isolation regions 11a and 11b. In this case, the offset spacers 15e do not necessarily need to be formed. Thereafter, p-type extension regions 16 are formed in regions on sides of the gate electrode 13 of the active region 10A.

Next, as shown in FIG. 11(c), a silicon oxide film and a silicon nitride film are successively deposited on an entire surface of the semiconductor substrate 10 by, for example, CVD, and thereafter, the multilayer film of the silicon oxide film and the silicon nitride film is etched back to form sidewalls 19 on side surfaces of the gate electrode 13 with the offset spacers 15 being interposed therebetween, and sidewalls 19e on side surfaces of the isolation regions 11a and 11b with the offset spacers 15e being interposed therebetween. Here, the sidewall 19 includes an inner sidewall 17 that is made of the silicon oxide film and has an L-shaped cross-section, and an outer sidewall 18 that is made of the silicon nitride film formed on the inner sidewall 17. Similarly, the sidewall 19e includes an inner sidewall 17e that is made of the silicon oxide film and has an L-shaped cross-section, and an outer sidewall 18e that is made of the silicon nitride film formed on the inner sidewall 17e.

Next, as shown in FIG. 12(a), exposed portions of the semiconductor substrate 10 are etched to desired depths using as a mask a gate portion 50 having the gate insulating film 12, the gate electrode 13, the protective insulating film 14, the offset spacers 15 and the sidewalls 19, and a mask portion 50e having the offset spacers 15e and the sidewalls 19e. As a result, trench portions 20 are formed in regions (trench portion formation regions) that are end portions of the active region 10A and are located between the sidewalls 19 and the sidewalls 19e as viewed in the top. In this case, since the mask portion 50e is formed in regions (substrate regions) that are end portions of the active region 10A and are adjacent to the isolation regions 11a and 11b, the semiconductor substrate 10 is left between the isolation region 11a and the trench portion 20 and between the isolation region 11b and the trench portion 20. Therefore, entire inner walls of the trench portions 20 are formed of the semiconductor substrate 10 without the isolation regions 11a and 11b being exposed to the inside of the trench portions 20.

Next, as shown in FIG. 12(b), a p-type SiGe layer 21 is epitaxially grown to fill the trench portions 20 in a manner similar to the step of FIG. 7(b) of the second embodiment. Thereafter, the semiconductor substrate 10 is subjected to thermal processing so that a p-type impurity in the p-type SiGe layer 21 is diffused into the semiconductor substrate 10. As a result, p-type impurity regions 22 are formed in regions between the isolation regions 11a and 11b and the p-type SiGe layer 21 of the active region 10A. In this case, boron (p-type impurity) may be implanted into the active region 10A including the p-type SiGe layer 21 using the gate electrode 13 and the sidewalls 19 as a mask before thermal processing is performed to form the p-type impurity regions 22.

Next, as shown in FIG. 12(c), the protective insulating film 14 provided on the gate electrode 13 is removed, and thereafter, a metal film made of, for example, nickel (Ni), cobalt (Co), platinum (Pt) or the like is deposited on the semiconductor substrate 10 by sputtering or the like. Thereafter, the deposited metal film is subjected to annealing to form a metal silicide layer 23 on each of the gate electrode 13 and the p-type SiGe layer 21. Thereafter, an interlayer insulating film, a contact plug, a metal wiring and the like (not shown) are formed on the semiconductor substrate 10, thereby completing fabrication of the semiconductor device of this embodiment.

According to the method for fabricating the semiconductor device of this embodiment, the trench portions 20 are formed using the mask portion 50e covering boundary regions (substrate regions) that are end portions of the active region 10A and are located between the active region 10A and the isolation regions 11a and 11b as in the second embodiment and its variation. As a result, the trench portions are formed without the isolation regions 11a and 11b being exposed, so that the p-type SiGe layer 21 can be epitaxially grown in the trenches in a satisfactorily controlled manner. Also, in the method for fabricating the semiconductor device of this embodiment, upper surfaces of the isolation regions 11a and 11b are caused to be higher than an upper surface of the semiconductor substrate 10, thereby providing step-like portions. As a result, the mask portion 50e can be formed in a self-aligned manner at the step-like portions during formation of the sidewalls 19 of the MIS transistor. As a result, according to the method for fabricating the semiconductor device of this embodiment, a semiconductor device that includes the p-type SiGe layer 21 having satisfactory quality and can operate at high speed can be relatively easily fabricated.

Although the p-type impurity regions 22 are formed by diffusion of an impurity contained in the p-type SiGe layer 21 or p-type impurity ion implantation in the step of FIG. 12(b) of the fabrication method of this embodiment, the p-type impurity regions 22 may be formed in a manner similar to the fabrication methods of the first to third variations of the first embodiment.

Although the first to fourth embodiments of the present invention and their variations have been described using p-type MIS transistors, an n-type MIS transistor may be employed. For example, if an n-type SIC layer is used as a silicon mixed crystal layer instead of the p-type SiGe layer, an effect similar to the semiconductor device of the present invention and its method of fabrication can be obtained.

INDUSTRIAL APPLICABILITY

The semiconductor device of the present invention and its method of fabrication are useful for improving properties of a semiconductor device.

The invention claimed is:

1. A semiconductor device comprising:
   a semiconductor substrate;
   an isolation region formed in the semiconductor substrate;
   an active region made of the semiconductor substrate surrounded by the isolation region and having a trench portion;
   a MIS transistor of a first-conductivity type having a first gate electrode formed on the active region, a first sidewall spacer formed on a side surface of the first gate electrode, and a silicon mixed crystal layer of the first-conductivity type for generating stress in a channel region of the active region, the trench portion being located on a side of and below the gate electrode and filled with the silicon mixed crystal layer of the first-conductivity type;
   a substrate region provided between the trench portion and the isolation region, said substrate region formed on a side surface of the active region in a gate length direction and made of the semiconductor substrate; and
   a mask portion formed on the substrate region, and on the isolation region formed on the side surface of the active region in the gate length direction, wherein
   the mask portion includes a second gate electrode made of the same material as the first gate electrode and a second sidewall spacer formed on a side surface of the second gate electrode.

2. The semiconductor device of claim 1, wherein
   the second gate electrode is a dummy gate electrode formed on the isolation region, and
   the substrate region is covered with the second sidewall spacer.

3. The semiconductor device of claim 2, wherein
   the first sidewall spacer includes a first inner sidewall spacer made of a first insulating film having an L-shaped cross-section and a first outer sidewall spacer made of a second insulating film formed on the first inner sidewall spacer, and
   the second sidewall spacer includes only a second inner sidewall spacer made of the first insulating film having an L-shaped cross-section.

4. The semiconductor device of claim 1, wherein
   the isolation region includes a first isolation region and a second isolation region arranged in a gate length direction, the second isolation region having an isolation width larger than that of the first isolation region,
   a third gate electrode having a gate length larger than that of the first gate electrode is formed on the first isolation region, and
   the second gate electrode having a gate length substantially the same as a gate length of the first gate electrode is formed on the second isolation region.

5. The semiconductor device of claim 4, wherein the second gate electrode and the third gate electrode are dummy gate electrodes.

6. The semiconductor device of claim 1, wherein
   the first sidewall spacer includes a first inner sidewall spacer made of a first insulating film having an L-shaped cross-section and a first outer sidewall spacer made of a second insulating film formed on the first inner sidewall spacer, and
   the second sidewall spacer includes a second inner sidewall spacer made of the first insulating film having an L-shaped cross-section and a second outer sidewall spacer made of the second insulating film formed on the second inner sidewall spacer.

7. The semiconductor device of claim 1, wherein both of inner walls of the trench portion perpendicular to the gate length direction are formed of the semiconductor substrate.

8. The semiconductor device of claim 1, wherein an upper surface of the silicon mixed crystal layer has a height higher than or substantially equal to that of an upper surface of the semiconductor substrate immediately below the first gate electrode.

9. The semiconductor device of claim 1, wherein a metal silicide layer is formed on each of the first gate electrode and the silicon mixed crystal layer.

10. The semiconductor device of claim 1, wherein
    the MIS transistor is a p-type MIS transistor, and
    the silicon mixed crystal layer is a p-type SiGe layer.

11. The semiconductor device of claim 1, wherein an impurity region of the first-conductivity type formed in the substrate region.

12. The semiconductor device of claim 11, wherein the impurity region has a junction depth shallower than a bottom surface of the silicon mixed crystal layer.

13. The semiconductor device of claim 1, wherein an isolation width of the isolation region on which the mask portion is formed is twice to five times as long as a gate length of the first gate electrode.

14. The semiconductor device of claim 1, wherein the second gate electrode is formed on the isolation region and is in contact with the isolation region.

15. The semiconductor device of claim 1, wherein a metal silicide layer containing nickel is formed on the silicon mixed crystal layer.

16. The semiconductor device of claim 1, wherein a metal silicide layer containing platinum is formed on the silicon mixed crystal layer.

17. The semiconductor device of claim 1, wherein
    the MIS transistor is a n-type MIS transistor, and
    the silicon mixed crystal layer is a n-type SiC layer.

18. The semiconductor device of claim 1, wherein the silicon mixed crystal layer is formed between the first sidewall spacer and the second sidewall spacer so as to be in contact with the first sidewall spacer and the second sidewall spacer.

19. The semiconductor device of claim 1, further comprising a metal silicide layer formed on the first gate electrode, wherein
    the first gate electrode is made of a polysilicon film, and
    the metal silicide layer protrudes upward from an upper edge of the first sidewall spacer.

* * * * *